US010620538B2

(12) United States Patent
Nodera et al.

(10) Patent No.: US 10,620,538 B2
(45) Date of Patent: Apr. 14, 2020

(54) POSITIVE TYPE PHOTOSENSITIVE SILOXANE COMPOSITION, ACTIVE MATRIX SUBSTRATE, DISPLAY APPARATUS, AND METHOD OF MANUFACTURING ACTIVE MATRIX SUBSTRATE

(71) Applicants: Sakai Display Products Corporation, Sakai-shi, Osaka (JP); AZ ELECTRONIC MATERIALS (LUXEMBOURG) S.A.R.L., Luxembourg (LU)

(72) Inventors: Nobutake Nodera, Sakai (JP); Akihiro Shinozuka, Sakai (JP); Shinji Koiwa, Sakai (JP); Masahiro Kato, Sakai (JP); Takao Matsumoto, Sakai (JP); Takashi Fuke, Kakegawa (JP); Daishi Yokoyama, Kakegawa (JP); Katsuto Taniguchi, Kakegawa (JP)

(73) Assignees: Sakai Display Products Corporation, Sakai-shi, Osaka (JP); AZ ELECTRONIC MATERIALS (LUXEMBOURG) S.A.R.L., Luxembourg (LU)

( * ) Notice: Subject to any disclaimer, the term of this patent is extended or adjusted under 35 U.S.C. 154(b) by 129 days.

(21) Appl. No.: 15/546,596

(22) PCT Filed: Feb. 3, 2016

(86) PCT No.: PCT/JP2016/053261
§ 371 (c)(1),
(2) Date: Jul. 26, 2017

(87) PCT Pub. No.: WO2016/125836
PCT Pub. Date: Aug. 11, 2016

(65) Prior Publication Data
US 2018/0017869 A1    Jan. 18, 2018

(30) Foreign Application Priority Data
Feb. 4, 2015 (JP) .................. 2015-020399

(51) Int. Cl.
| *G02F 1/1368* | (2006.01) |
| *G02F 1/1333* | (2006.01) |
| *G03F 7/075* | (2006.01) |
| *G03F 7/023* | (2006.01) |
| *C08L 83/04* | (2006.01) |
| *G03F 7/039* | (2006.01) |
| *C08G 73/08* | (2006.01) |
| *C08G 77/00* | (2006.01) |
| *C08G 77/04* | (2006.01) |

(52) U.S. Cl.
CPC .............. *G03F 7/075* (2013.01); *C08G 73/08* (2013.01); *C08L 83/04* (2013.01); *G02F 1/1333* (2013.01); *G02F 1/1368* (2013.01); *G03F 7/023* (2013.01); *G03F 7/039* (2013.01); *G03F 7/0757* (2013.01); *C08G 77/04* (2013.01); *C08G 77/80* (2013.01)

(58) Field of Classification Search
CPC ........ G03F 7/075; G03F 7/0757; G03F 7/039; G03F 7/0392; G02F 1/1333; G02F 1/1368
USPC .............................. 430/270.1, 319, 321, 326
See application file for complete search history.

(56) References Cited

U.S. PATENT DOCUMENTS

| 5,380,555 A | 1/1995 | Mine et al. |
| 2012/0242923 A1 | 9/2012 | Miyamoto et al. |
| 2013/0023086 A1 | 1/2013 | Chikama et al. |
| 2013/0216952 A1 | 8/2013 | Yokoyama et al. |
| 2014/0335452 A1* | 11/2014 | Yokoyama ............ G03F 7/0233 430/270.1 |
| 2015/0291749 A1* | 10/2015 | Nonaka ................ G03F 7/0233 524/190 |
| 2015/0316824 A1 | 11/2015 | Ohishi |

FOREIGN PATENT DOCUMENTS

| JP | H06-240455 A | 8/1994 |
| JP | 2001-098224 A | 4/2001 |
| JP | 2008-153688 A | 7/2008 |
| JP | 2012-248865 A | 12/2012 |
| WO | WO2011104791 A1 | 9/2011 |
| WO | WO2012026400 A1 | 3/2012 |
| WO | WO2014163118 A1 | 10/2014 |

* cited by examiner

Primary Examiner — John A McPherson
(74) Attorney, Agent, or Firm — Michael J. Blessent; Bret E. Field; Bozicevic, Field & Francis LLP

(57) ABSTRACT

The present invention provides a positive type photosensitive siloxane composition in which a film formed by the same has high heat resistance, high strength and high crack resistance, an active matrix substrate in which by-product is not generated, an occurrence of defects is suppressed, and an interlayer insulating film is easily formed at a low cost while having good transmittance, a display apparatus including the active matrix substrate, and a method of manufacturing the active matrix substrate. An active matrix substrate includes a plurality of gate wirings provided so as to extend parallel to each other on an insulating substrate, and a plurality of source wirings provided so as to extend parallel to each other in a direction intersecting the respective gate wirings. An interlayer insulating film and a gate insulating film are interposed at portions including the intersecting portions of the gate wirings and the source wirings, on a lower side of the source wiring. The interlayer insulating film is formed using the positive type photosensitive siloxane composition without using a resist.

12 Claims, 16 Drawing Sheets

POSITIVE TYPE PHOTOSENSITIVE SILOXANE COMPOSITION, ACTIVE MATRIX SUBSTRATE, DISPLAY APPARATUS, AND METHOD OF MANUFACTURING ACTIVE MATRIX SUBSTRATE

CROSS-REFERENCE TO RELATED APPLICATIONS

This application is the national phase under 35 U.S.C. § 371 of PCT International Application No. PCT/JP2016/053261 which has an International filing date of Feb. 3, 2016 and designated the United States of America.

FIELD

The present invention relates to a positive type photosensitive siloxane composition used for a film of a semiconductor device, or the like, an active matrix substrate having a cured film of the positive type photosensitive siloxane composition and included in a television receiving apparatus, a personal computer, or the like, a display apparatus including the active matrix substrate, and a method of manufacturing the active matrix substrate.

BACKGROUND

Among display apparatuses, a liquid crystal display apparatus is a thin type display and has characteristics such as low power consumption. In particular, a liquid crystal display apparatus including an active matrix substrate provided with a switching element such as a thin film transistor (TFT) for each pixel has a high contrast ratio and excellent response characteristics, and exhibits a high performance. Therefore, such an apparatus is suitably used in a television receiving apparatus, a personal computer or the like.

The active matrix substrate includes a plurality of gate wirings (scanning lines), and a plurality of source wirings (signal wirings) intersecting each gate wiring through an interlayer insulating film, which are formed thereon, and thin film transistors for switching pixels are provided in the vicinity of intersecting portions of the gate wirings and the source wirings (for example, Japanese Patent Laid-open Publication No. 2008-153688, etc.). Since a capacitance (parasitic capacitance) formed at the intersecting portion of the gate wiring and the source wiring causes a deterioration in display quality, it is preferable to reduce the capacitance, and an interlayer insulating film including a spin on glass (SOG) material is formed on the intersecting portions. In the active matrix substrate of Japanese Patent Laid-open Publication No. 2008-153688, the interlayer insulating film is made of the SOG material containing a siloxane composition having a Si—O—C bond as a skeleton.

In Japanese Patent Laid-open Publication No. 2008-153688, as the siloxane composition, specifically, there are a composition in which a siloxane oligomer and a void-forming material are uniformly dissolved in an organic solvent (Japanese Patent Laid-open Publication No. 2001-98224), and a composition containing a silicon resin represented by a general formula below as a main agent:

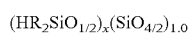

(wherein R is a hydrogen atom, or a group selected from a group consisting of an alkyl group and an aryl group, and X is $0.1 \leq X \leq 2.0$) (Japanese Patent Laid-open Publication No. H6-240455).

FIG. 15 is a schematic cross-sectional view illustrating an example for a structure of a portion of a conventional active matrix substrate 60, in which a TFT 61 is formed.

As illustrated in FIG. 15, a gate electrode 11a (forming a part of a gate wiring 11) and a capacitance wiring 13 are formed on an insulating substrate 10 made of glass of the active matrix substrate 60.

An interlayer insulating film 14 is formed on the insulating substrate 10 so as to cover the same. The interlayer insulating film 14 is made of the SOG material containing the above-described siloxane composition and the like. On the gate electrode 11a and on the capacitance wiring 13, portions other than the respective end edge parts thereof are not covered with the interlayer insulating film 14, and opening parts Ca and Ca are formed therein. A gate insulating film 15 is formed on the interlayer insulating film 14, and a semiconductor film 16 is formed on a portion of the gate insulating film 15 corresponding to the opening part Ca on the gate electrode 11a side. In addition, an n$^+$ film 17 is formed on the semiconductor film 16 so as to cover the same, a source region and a drain region are formed therein, and a source electrode 18 and a drain electrode 19 are formed on the source region and the drain region. The TFT 61 is constituted by the gate electrode 11a, the gate insulating film 15, the semiconductor film 16, the n$^+$ film 17, the source electrode 18, and the drain electrode 19.

In addition, a passivation film 21 is formed on the source electrode 18 and the drain electrode 19 so as to cover the same, and an interlayer insulating film 22 including an organic material is formed on the passivation film 21 so as to cover the same.

Further, in the opening part Ca on the capacitance wiring 13 side, a capacitance electrode 20 is formed on the gate insulating film 15. A pixel electrode 23 is formed in an opening part Cb on the capacitance electrode 20.

FIG. 16 is a flowchart illustrating a processing procedure for forming the interlayer insulating film 14.

An SOG material is applied to the insulating substrate 10, the gate wiring 11, and the capacitance wiring 13 to form a coating film (S11).

After forming the coating film, the coating film is baked to adjust a thickness thereof (S12).

After the bake, a photoresist material is applied to the coating film to form a resist (S13).

The resist is exposed to light using a photomask (S14), and is developed (S15) to form a resist pattern.

Next, a portion of the coating film which is not covered with the resist is subjected to etching such as dry etching using, for example, a mixed gas of carbon tetrafluoride and oxygen (S16) to form the opening parts Ca.

Finally, the resist is removed (S17).

SUMMARY

In the above-described active matrix substrate of Japanese Patent Laid-open Publication No. 2008-153688, etc., there are problems that, when forming the interlayer insulating film 14 including the SOG material made of the siloxane composition between the gate wiring 11 and the source wiring, in order to form the opening parts Ca, a resist applying process, an etching process, and a resist removal process are required, such that the manufacturing process is complicated and the manufacturing costs are increased.

In addition, there are problems that a film strength of the interlayer insulating film made of the above-described siloxane composition is weak, and when a film stress occurs due to a difference in a heat expansion rate at a low temperature, warping occurs in the substrate, and difficulties in the processing flow of the substrate is generated in the manufacturing apparatus. Further, there are also problems that cracks occur in the film due to the film stress, peeling-off and distortion occur in the film, and a focus deviation occurs in the exposing process, thus to cause a decrease in yield.

There is also a problem that, when cracks occur, defects occur due to foreign matters derived from the siloxane composition resulting therefrom.

Moreover, an occurrence rate of defects is increased due to by-products generated by etching, the yield is decreased, and costs are further increased. Since leakage occurs between the wirings due to the by-products, application of the interlayer insulating film 14 to additional regions is required in addition to the necessary regions, that is, the opening portion of the interlayer insulating film 14 is limited to a part such as a portion in which the TFT 61 is formed and a portion in which the opening part Ca is formed on the capacitance wiring 13, and an opening area of the interlayer insulating film 14 is small, such that it becomes a factor of decreasing a transmittance of a panel, and in order to compensate for this, it is necessary to use a backlight with high luminance.

In consideration of the above-mentioned circumstances, it is an object of the present invention to provide a positive type photosensitive siloxane composition in which a film formed by the same has high heat resistance, low temperature curability, high strength, and high crack resistance, without occurrences of substrate warpage and defects due to impurities, while providing good pattern formability; an active matrix substrate in which an interlayer insulating film is formed by using the siloxane composition with an occurrence of defects suppressed, without generating by-products, with an improved yield and at a low cost since a resist is not used, while having good light transmittance; a display apparatus including the active matrix substrate; and a method of manufacturing the active matrix substrate.

A positive type photosensitive siloxane composition according to one embodiment of the present invention, comprises: (I) at least two or more of polysiloxanes having different dissolution rates in a tetramethylammonium hydroxide (TMAH) aqueous solution, (II) a diazonaphthoquinone derivative, (III) a photoacid generator, and (IV) a solvent, wherein the polysiloxane (I) is a mixture of:

(A) polysiloxane (Ia) whose film obtained by hydrolyzing and condensing a silane compound represented by formula (1) below in the presence of a basic catalyst, after the prebake, is soluble in a 5 mass % TMAH aqueous solution, and has a dissolution rate of 1000 Å/sec or less:

(wherein $R^1$ represents a linear, branched or cyclic alkyl group having 1 to 20 carbon atoms, in which arbitrary methylene may be substituted with oxygen, or an aryl group having 6 to 20 carbon atoms, in which arbitrary hydrogen may be substituted with fluorine, $R^2$ represents an alkyl group having 1 to 5 carbon atoms, and n represents 0 or 1), and (B) polysiloxane (Ib) whose film obtained by hydrolyzing and condensing the silane compound represented by formula (1) in the presence of a basic catalyst or an acid catalyst, after the prebake, has a dissolution rate of 100 Å/sec or more in a 2.38 mass % TMAH aqueous solution.

An active matrix substrate according to one embodiment of the present invention, comprises: a plurality of source wirings and a plurality of gate wirings formed on a substrate so as to intersect each other three-dimensionally; thin film transistors formed in the vicinity of portions in which the source wirings and the gate wirings intersect; and pixel electrodes formed to be electrically connected to the corresponding source wirings through the thin film transistors, wherein an interlayer insulating film made of a cured material of the positive type photosensitive siloxane composition according to the embodiment is interposed at least between the source wiring and the gate wiring.

A display apparatus according to one embodiment of the present invention, comprises: the active matrix substrate according to the embodiment; a display medium layer disposed on the active matrix substrate; and an opposite substrate disposed opposite to the active matrix substrate through the display medium layer.

A method of manufacturing an active matrix substrate according to one embodiment of the present invention, comprises the processes of forming a plurality of source wirings and a plurality of gate wirings on a substrate so as to intersect each other three-dimensionally; forming thin film transistors in the vicinity of portions in which the source wirings and the gate wirings intersect; and forming pixel electrodes to be electrically connected to the corresponding source wirings through the thin film transistors, and further comprises an interlayer insulating film forming process of forming the interlayer insulating film made of a hardened material of the positive type photosensitive siloxane composition according to claim 10 at least between the source wiring and the gate wiring, wherein the interlayer insulating film forming process comprises the processes of a film forming process of forming the film using the positive type photosensitive siloxane composition; prebaking the formed film; exposing the prebaked film to light; developing the exposed film; and baking the developed film.

According to the positive type photosensitive siloxane composition of the present invention, the formed film has high heat resistance, low temperature curability, high strength and high crack resistance. In addition, the composition has good solubility in an alkaline developer, and has good pattern formability, without an occurrence of so-called "pattern flow" in which the film is melted by a lowering of viscosity due to a high temperature before the thermal curing of the pattern is sufficiently progressed, and patterns such as holes and lines flow after the developing process.

According to the active matrix substrate of the present invention, the interlayer insulating film is formed, without using a resist, with the occurrence of defects suppressed, without generating by-products, with an improved yield and at a low cost, while having good light transmittance.

According to the display apparatus of the present invention, the transmittance is good.

According to the method of manufacturing an active matrix substrate of the present invention, when forming a film containing the siloxane composition, and then patterning the same, since the resist applying process, the etching process, and the resist removal process are unnecessary, it is possible to reduce the manufacturing costs. Further, by eliminating the etching process, by-products are not generated, an occurrence rate of defects is decreased, and the yield is improved.

The above and further objects and features will more fully be apparent from the following detailed description with accompanying drawings.

DETAILED DESCRIPTION

Figure 1:
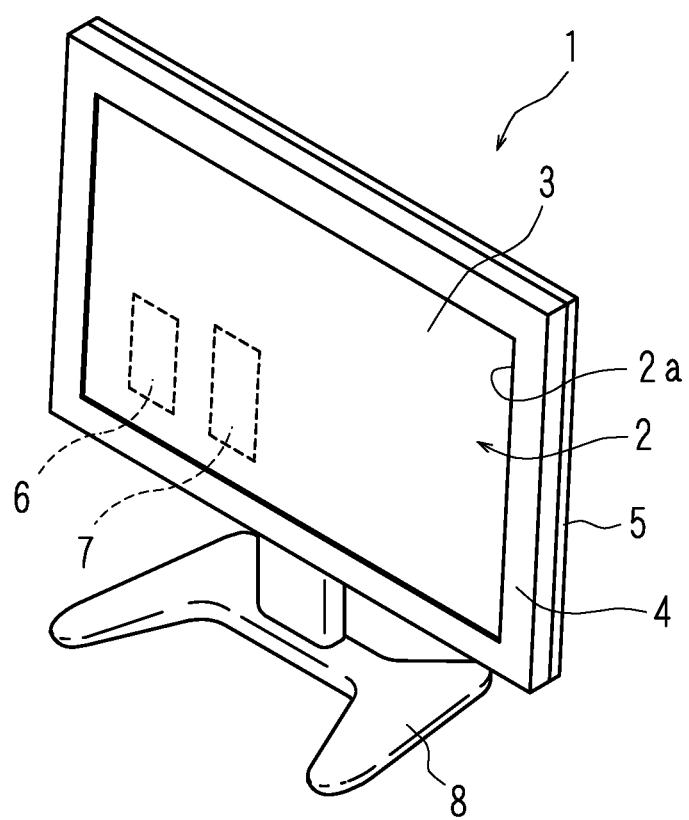
FIG. 1 is a schematic perspective view illustrating a television receiving apparatus according to Embodiment 1 of the present invention.

Hereinafter, the present invention will be described in detail with reference to the accompanying drawings illustrating embodiments thereof.

1. Positive Type Photosensitive Siloxane Composition

The positive type photosensitive siloxane composition (hereinafter, referred to as a "siloxane composition") according to the present invention comprises (I) at least two or more of polysiloxane having different solubilities in a TMAH aqueous solution, (II) a diazonaphthoquinone derivative, (III) a photoacid generator, and (IV) a solvent.

(I) Polysiloxane

As polysiloxane having high heat resistance, silsesquioxane having a silanol group as a crosslinking point is preferable. The silanol group forms a siloxane bond by heating, and may impart high heat resistance. Silsesquioxane is preferable because it is suitable for low temperature curing and provides good pattern stability. A so-called cage-type or ladder-type silsesquioxane is more preferable because it has high crack resistance. Although a silicon resin has high crack resistance, it is too soft, therefore it is not preferable as a material for an interlayer insulating film, as well as the thermal stability of a pattern shape is inferior. In general, the cage-type silsesquioxane and the ladder-type silsesquioxane have reduced free silanol groups, and therefore have low solubility in an alkaline developer. Accordingly, as the photosensitive composition, siloxane having low solubility in the alkaline developer and siloxane having high solubility in the alkaline developer are used in combination. As two polysiloxanes, there may be the following polysiloxane (Ia) and polysiloxane (Ib).

The polysiloxane (Ia) is characterized in that a film obtained by hydrolyzing and condensing a silane compound represented by formula (1) below in the presence of a basic catalyst, after the prebake, is soluble in a 5 mass % TMAH aqueous solution, and has a solubility of 1000 Å/sec or less.

$$R^1{}_n Si(OR^2)_{4-n} \qquad (1)$$

(wherein $R^1$ represents a linear, branched or cyclic alkyl group having 1 to 20 carbon atoms, in which arbitrary methylene may be substituted with oxygen, or an aryl group having 6 to 20 carbon atoms, in which arbitrary hydrogen may be substituted with fluorine, $R^2$ represents an alkyl group having 1 to 5 carbon atoms, and n represents 0 or 1.)

Specific examples of the silane compound of n=1 in the general formula (1) may include, for example, methyltrimethoxysilane, methyltriethoxysilane, phenyltrimethoxysilane, phenyltriethoxysilane or the like. These compounds are preferable in terms of exhibiting excellent chemical resistance, thermal stability, solvent solubility, and crack resistance, respectively.

Specific examples of the silane compound of n=0 in the general formula (1) may include tetramethoxysilane, tetraethoxysilane or the like. By reacting the silane compound of n=0 in the general formula (1), it is possible to increase a prevention effect of "pattern flow" at the time of heat curing by introducing a silica structure (SiO$_2$) into silsesquioxane (SiO$_{1.5}$).

The polysiloxane (Ib) is characterized in that a film obtained by hydrolyzing and condensing at least a silane compound of n=1 in the general formula (1) in the presence of a basic catalyst or acid catalyst, after the prebake, has a solubility of 100 Å/sec or more in a 2.38 mass % TMAH aqueous solution.

A content of the silica structure of the polysiloxanes (Ia) and (Ib) (silane compound of n=0) is preferably 20 mol % or less, and more preferably 5 mol % or more and 20 mol % or less with respect to polysiloxane (I), respectively. Further, the content thereof is preferably 10 mol % or more and 15 mol % or less. When the content thereof exceeds 20 mol %, stability of a polymer is remarkably deteriorated. When the content thereof is 20 mol % or less, the prevention effect of "pattern flow" is improved, and the stability of the polymer is good.

(Measurement and Calculation Method of Alkaline Dissolution Rate (ADR))

The dissolution rate of the polysiloxanes (Ia) and (Ib) in a TMAH aqueous solution is measured and calculated as follows.

First, polysiloxane is diluted in propyleneglycol monomethylether acetate (PGMEA) so as to be about 35 mass % and dissolved. This solution is spin-coated on a silicon wafer in such a way that a dry thickness of the film is about 2 μm, and then is heated on a hot plate at 100° C. for 60 seconds to remove the solvent. The thickness of the coating film is measured with a spectroscopic ellipsometer (manufactured by Woollam Co.). Next, the silicon wafer having the film is immersed in a 5% TMAH aqueous solution for the polysiloxane (Ia) and in a 2.38% TMAH aqueous solution for the polysiloxane (Ib) at room temperature (25° C.), and a time until the film disappears is measured. The dissolution rate is obtained by dividing an initial thickness of the film by the time until the film disappears. When the dissolution rate is remarkably slow, the thickness of the film is measured after the immersion for a prescribed time, and the dissolution rate is calculated by dividing an amount of change in the thickness before and after the immersion by the immersion time.

Also in any polymer of the polysiloxanes (Ia) and (Ib), a mass average molecular weight in terms of polystyrene is preferably from 700 to 10,000, and more preferably from 1,000 to 4,000. When the molecular weight is too large, since there are problems that sufficient resolution may not be obtained due to development residues, or the like, and sensitivity is decreased, it is preferable to adjust the alkaline dissolution rate so as not to increase the molecular weight.

A mixing ratio of the polysiloxanes (Ia) and (Ib) may be adjusted in an arbitrary ratio depending on the thickness of the interlayer insulating film, sensitivity of the photosensitive composition, resolution and the like. However, when the polysiloxane (Ia) is included in an amount of 20 mass % or more, the "pattern flow" prevention effect during heat curing is good, thus being preferable.

(II) Diazonaphthoquinone Derivative

The siloxane composition according to the present invention contains a diazonaphthoquinone derivative, such that an exposed part becomes soluble in an alkaline developer and constitutes a positive type which is removed by development. The diazonaphthoquinone derivative according to the present invention is a compound obtained by ester-bonding naphthoquinone diazide sulfonic acid to a compound having a phenolic hydroxyl group, and a structure thereof is not particularly limited, but an ester compound with a compound having one or more phenolic hydroxyl groups is preferable. As the naphthoquinone diazide sulfonic acid, 4-naphthoquinone diazide sulfonic acid or 5-naphthoquinone diazide sulfonic acid may be used. Since a 4-naphthoquinone diazide sulfonic acid ester compound absorbs light in an i-line (wavelength 365 nm) region, it is suitable for i-line exposure. In addition, since a 5-naphthoquinone diazide sulfonic acid ester compound absorbs light in wide range of wavelengths, it is suitable for exposure in a wide range of wavelengths. It is preferable to select the 4-naphthoquinone diazide sulfonic acid ester compound or the 5-naphthoquinone diazide sulfonic acid ester compound depending on the wavelength to be exposed. It is also possible to mix and use the 4-naphthoquinone diazide sulfonic acid ester compound and the 5-naphthoquinone diazide sulfonic acid ester compound.

The compound having a phenolic hydroxyl group is not particularly limited, but examples thereof may include the following compounds (made by Honshu Chemical Industry Co., Ltd., product name added).

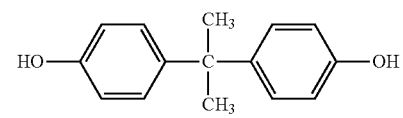

Bisphenol A

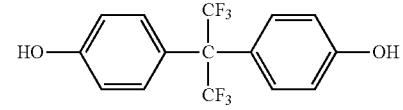

BisP-AF

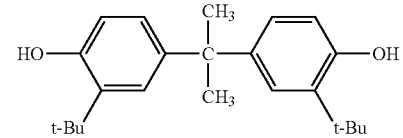

BisOTBP-A

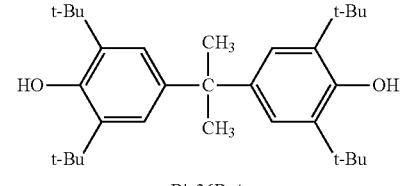

Bis26B-A

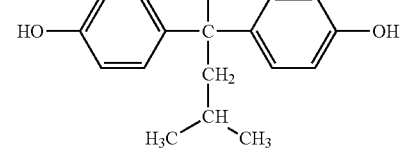

BisP-MIBK

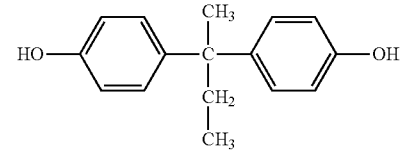

BisP-B

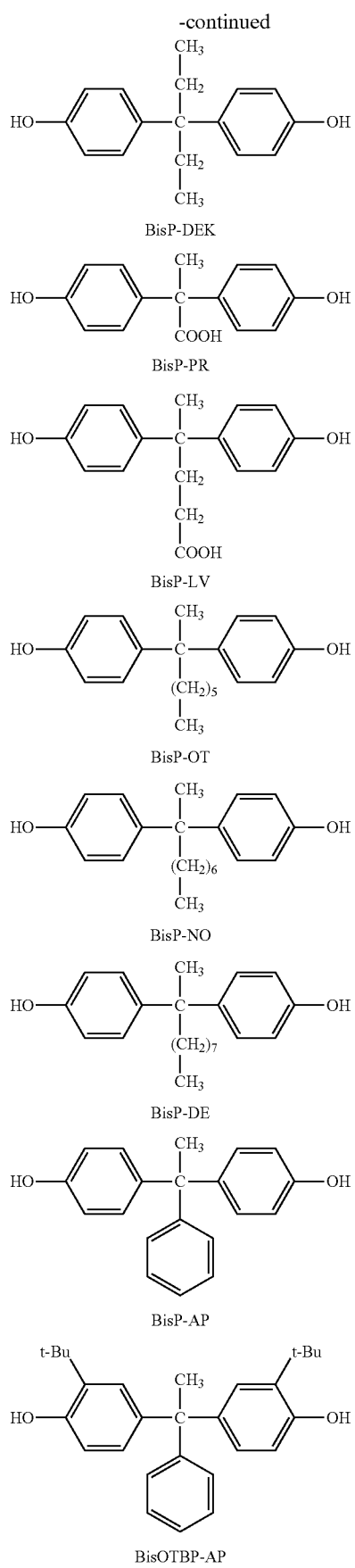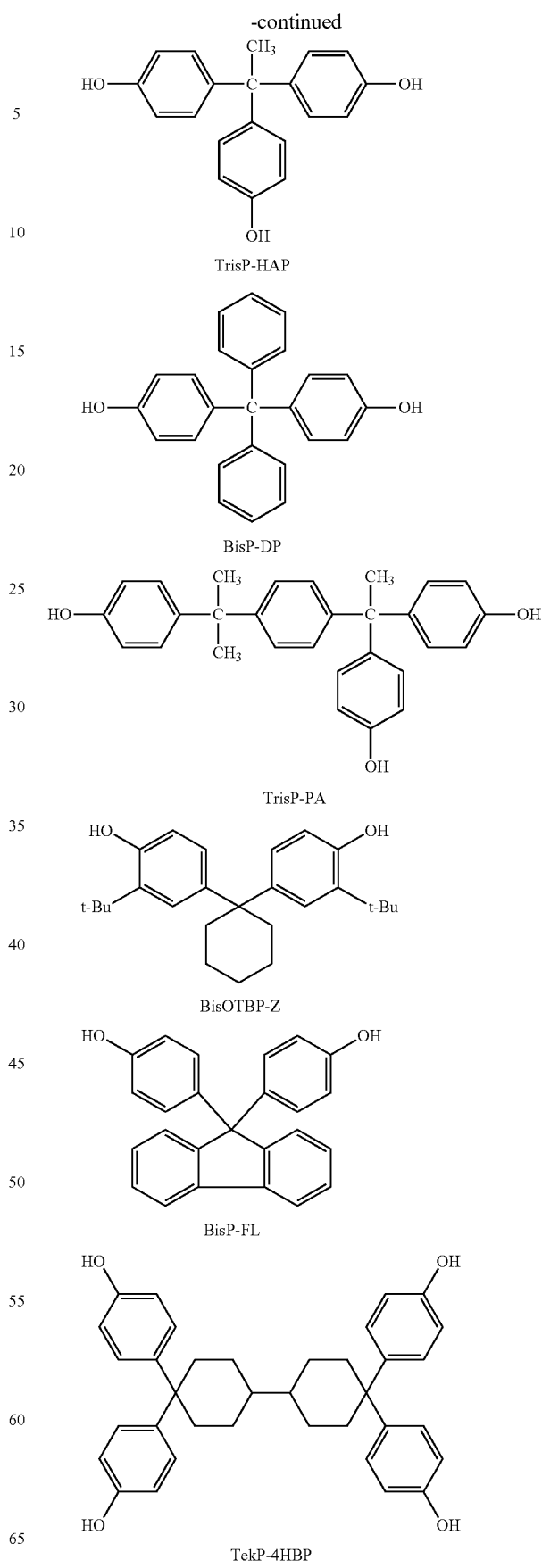

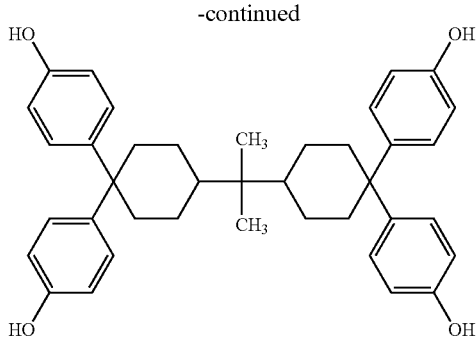

TekP-4HBPA

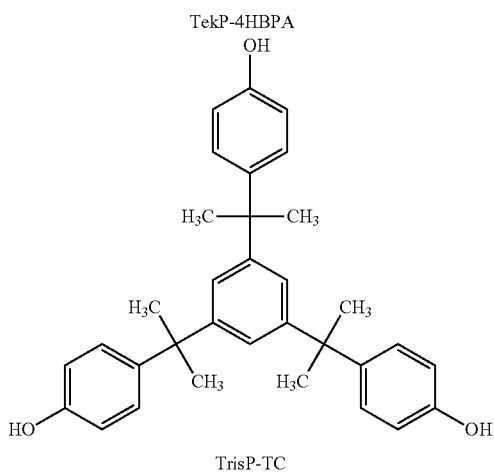

TrisP-TC

A preferable addition amount of the diazonaphthoquinone derivative is determined by an esterification ratio of the naphthoquinone diazide sulfonic acid, physical properties of polysiloxane to be used, the required sensitivity, a dissolution contrast between the exposed part and an unexposed part, and the like, but as a use of the interlayer insulating film of the present invention, 3 parts by mass or more and 10 parts by mass or less is preferable, and 5 parts by mass or more and 7 parts by mass or less is more preferable, with respect to 100 parts by mass of the polysiloxane (I). When the addition amount of the diazonaphthoquinone derivative is less than 3 parts by mass, the dissolution contrast between the exposed part and the unexposed part is too low, and it is not sensitive to light in reality. Further, in order to obtain better dissolution contrast, 5 parts by mass or more is preferable. Meanwhile, it has been confirmed by experiments that, when the addition amount of the diazonaphthoquinone derivative is more than 10 parts by mass, coloring by the decomposition of the quinonediazide compound due to the thermal curing or thermal budget is more apparent, and the colorless transparency of the cured film is decreased. Furthermore, a deterioration in electrical insulation of the cured material and a release of gas occur due to thermal decomposition, which may cause problems in the subsequent process.

(III) Photoacid Generator

The siloxane composition according to the present invention contains a photoacid generator. When irradiating with radiation, the photoacid generator releases acids that promote condensation of the silanol group by decomposition. Herein, examples of radiation may include visible light, ultraviolet light, infrared light, X-rays, electron beam, α-rays, γ-rays and the like. In particular, it is preferable that acids are generated by ultraviolet rays used for manufacturing a thin film transistor.

A preferable addition amount of the photoacid generator is determined by types of the active substance generated by decomposition, the generation amount, the required sensitivity, the dissolution contrast between the exposed part and the unexposed part, and the like, but preferably 0.01 parts by mass or more and 10 parts by mass or less, and more preferably 0.1 parts by mass or more and 5 parts by mass or less with respect to 100 parts by mass of the polysiloxane (I). When the addition amount is less than 0.01 parts by mass, there may be no effect obtained by addition. Meanwhile, when the addition amount is more than 10 parts by mass, cracks may occur in the film to be formed, coloring by the decomposition is more apparent, or the colorless transparency of the film is decreased. Meanwhile, when the addition amount is large, deterioration of electrical insulation of a cured material and release of gas occur due to thermal decomposition, which may cause an undesirable effect with regards to providing a protective film. When the photoacid generator is included in an amount of 0.01 parts by mass or more and 10 parts by mass or less with respect to 100 parts by mass of the polysiloxane (I), a condensation reaction of the silanol in the polysiloxane is promoted by the acids generated after the irradiation with light, curing at a low temperature is progressed, and it is possible to achieve a high resolution without pattern flow.

Specific examples of the photoacid generator may include diazomethane compounds, diphenyliodonium salts, triphenylsulfonium salts, sulfonium salts, ammonium salts, phosphonium salts, sulfonimide compounds and the like. The structure of these photoacid generators may be represented by the following general formula (2).

$$R^+X^- \quad (2)$$

Wherein $R^+$ represents an organic ion selected from a group consisting of hydrogen, alkyl, aryl, alkenyl, acyl, and alkoxyl groups which are modified with carbon atoms or other heteroatoms, for example, diphenyliodonium ions, triphenyl sulfonium ions.

It is preferable that $X^-$ is any counter ion represented by the following general formulae.

$SbY_6^-$
$AsY_6^-$
$R^a_p PY_{6-p}^-$
$R^a_q BY_{4-q}^-$
$R^a_q GaY_{4-q}^-$
$R^a SO_3^-$
$(R^a SO_2)_3 C^-$
$(R^a SO_2)_2 N^-$
$R^b COO^-$
$SCN^-$ (wherein Y is a halogen atom, $R^a$ is an alkyl group having 1 to 20 carbon atoms or an aryl group having 6 to 20 carbon atoms, which is substituted with a substituent selected from fluorine, a nitro group and a cyano group, $R^b$ is hydrogen or an alkyl group having 1 to 8 carbon atoms, p is a number from 0 to 6, and q is a number from 0 to 4.

Specific counter ions may include any one selected from a group consisting of $BF_4^-$, $(C_6F_5)_4B^-$, $((CF_3)_2C_6H_3)_4B^-$, $PF_6^-$, $(CF_3CF_2)_3PF_3^-$, $SbF_6^-$, $(C_6F_5)_4Ga^-$, $((CF_3)_2C_6H_3)_4Ga^-$, $SCN^-$, $(CF_3SO_2)_3C^-$, $(CF_3SO_2)_2N^-$, formic acid ion, acetate ion, trifluoromethanesulfonate ion, nonafluorobutanesulfonate ion, methanesulfonate ion, butanesulfonate ion, benzenesulfonate ion, p⁻ toluenesulfonate ion, and a sulfonate ion.

Among the photoacid generators used in the present invention, in particular, compounds that generate sulfonic acids or boric acids are particularly preferable, and for example, may include tolylcumyliodonium tetrakis (pentafluorophenyl) boric acid ("PHOTOINITIATOR 2074" (trade name) manufactured by Rhodia), diphenyliodonium tetra (perfluorophenyl) boric acid, compounds whose cation moiety is sulfonium ions, and compounds whose anion moiety is pentafluoroborate ions. In addition, triphenylsulfonium trifluoromethanesulfonic acid, triphenylsulfonium camphorsulfonic acid, triphenylsulfonium tetra (perfluorophenyl) boric acid, 4-acetoxyphenyldimethylsulfonium hexafluoroarsenate, 1-(4-n-butoxynaphthalene-1-yl) tetrahydrothiophenium trifluoromethanesulfonic acid, 1-(4,7-dibutoxy-1-naphthalenyl) tetrahydrothiophenium trifluoromethanesulfonic acid, diphenyliodonium trifluoromethanesulfonic acid, diphenyliodonium hexafluoroarsenate, and the like may be exemplified. Furthermore, a photoacid generator represented by the following formula may also be used.

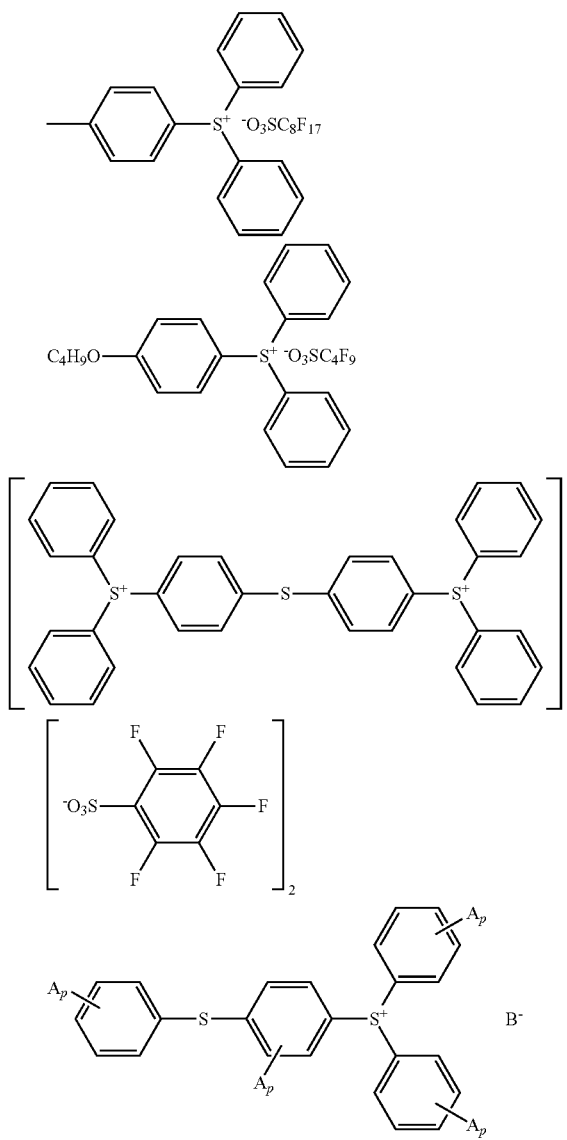

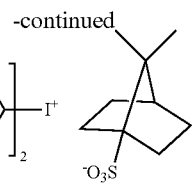

-continued

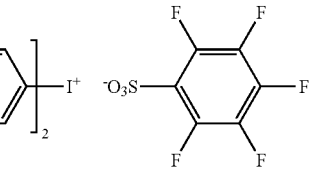

Wherein, A is each independently a substituent selected from an alkyl group having 1 to 20 carbon atoms, an alkoxy group having 1 to 20 carbon atoms, an aryl group having 6 to 20 carbon atoms, an alkylcarbonyl group having 1 to 20 carbon atoms, an arylcarbonyl group having 6 to 20 carbon atoms, a hydroxyl group, and an amino group, p is each independently an integer of 0 to 5, and examples of $B^-$ may include a fluorinated alkyl sulfonate group, a fluorinated aryl sulfonate group, fluorinated alkyl borate group, an alkyl sulfonate group, an aryl sulfonate group and the like. It is also possible to use compounds in which the cations and anions shown in these formulae are exchanged with each other, and photoacid generators in which the cations or anions shown in these formulae and the above-described various cations or anions are combined with each other. For example, a combination of any one of the sulfonium ions represented by the formulae and tetra (perfluorophenyl) borate ions, and a combination of any one of the iodonium ions represented by the formulae and tetra (perfluorophenyl) borate ions may also be used as the photoacid generator.

(IV) Solvent

Examples of the solvent may include: ethyleneglycol monoalkylethers such as ethyleneglycol monomethylether, ethyleneglycol monoethylether, ethyleneglycol monopropylether and ethyleneglycol monobutylether; diethyleneglycol dialkylethers such as diethyleneglycol dimethylether, diethyleneglycol diethylether, diethyleneglycol dipropylether, and diethyleneglycol dibutylether; ethyleneglycol alkylether acetates such as methyl cellosolve acetate and ethyl cellosolve acetate; propyleneglycol alkylether acetates such as propyleneglycol monomethylether acetate (PGMEA), propyleneglycol monoethylether acetate, and propyleneglycol monopropylether acetate; aromatic hydrocarbons such as benzene, toluene and xylene; ketones such as methylethyl ketone, acetone, methylamyl ketone, methylisobutyl ketone, cyclohexanone; alcohols such as ethanol, propanol, butanol, hexanol, cyclohexanol, ethyleneglycol and glycerin; esters such as ethyl 3-ethoxypropionate and methyl 3-methoxypropionate; and cyclic esters such as γ-butyrolactone and the like. These solvents may be used alone or in combination of two or more thereof. An amount of the solvent to be used is determined depending on an application method and the required amount of the film thickness after the application.

In the positive type photosensitive siloxane composition according to the present invention, the formed film has high heat resistance, low temperature curability, high strength, and high crack resistance. Further, solubility in an alkaline developer is good, and pattern formability is good without the occurrence of pattern flow.

2. Display Apparatus

Hereinafter, an active matrix substrate according to the present invention, a display apparatus including the active matrix substrate, and a method of manufacturing an active matrix substrate will be described.

Embodiment 1

Figure 2:
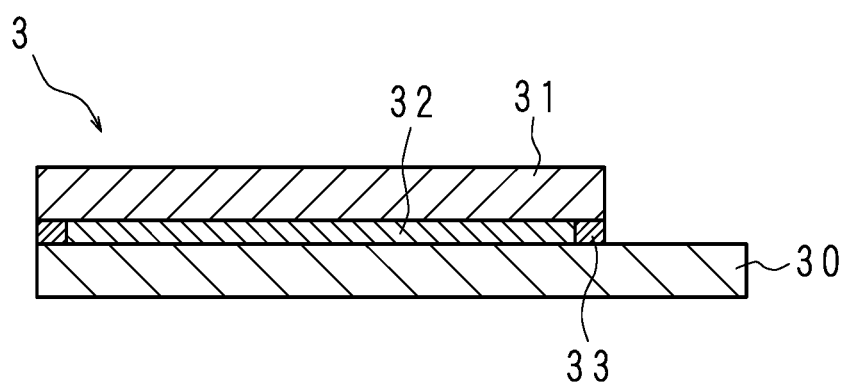
FIG. 2 is a schematic cross-sectional view illustrating a display panel according to Embodiment 1 of the present invention.
Figure 3:
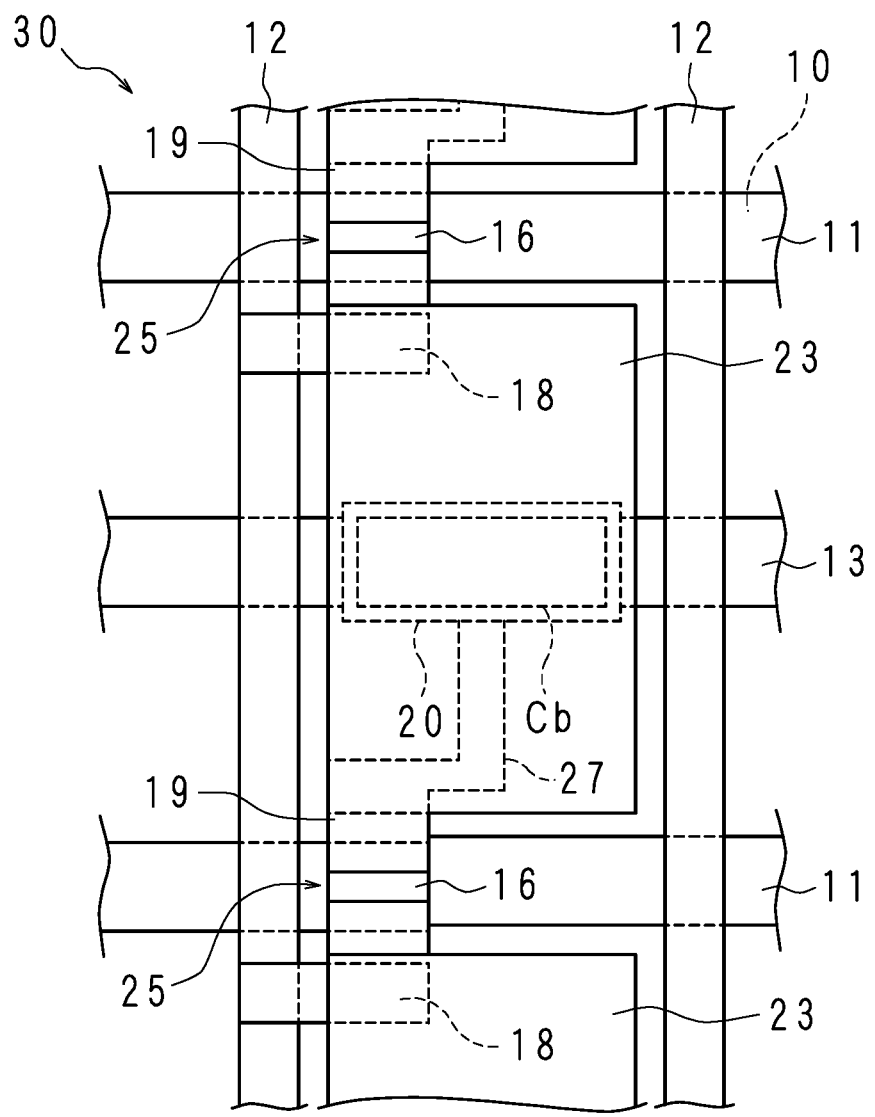
FIG. 3 is a schematic plan view illustrating pixels of an active matrix substrate according to Embodiment 1 of the present invention.
Figure 4:
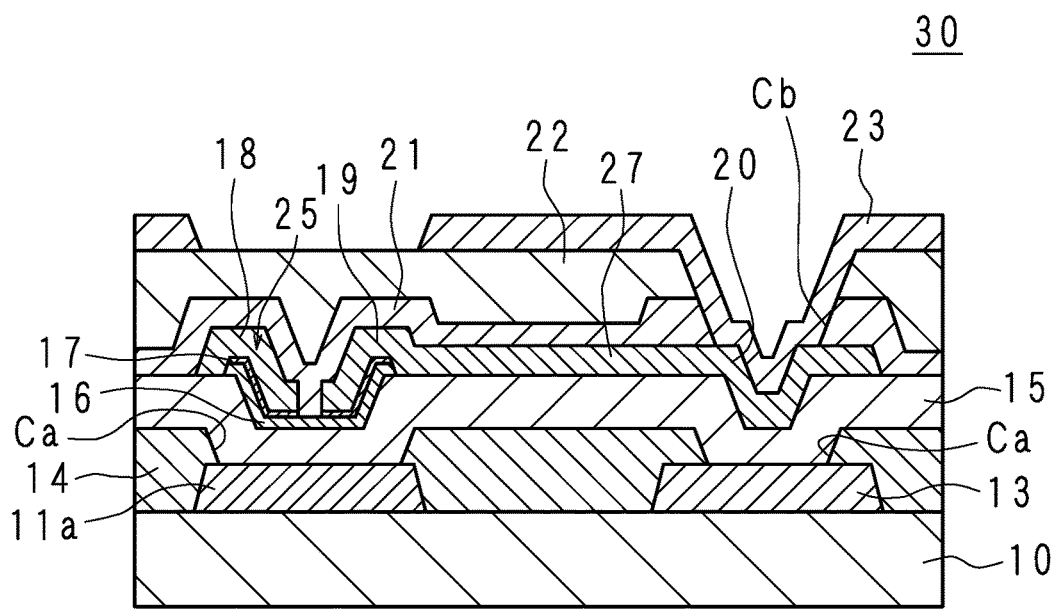
FIG. 4 is a schematic cross-sectional view illustrating a portion of the active matrix substrate according to Embodiment 1 of the present invention, in which a TFT is provided.
Figure 5:
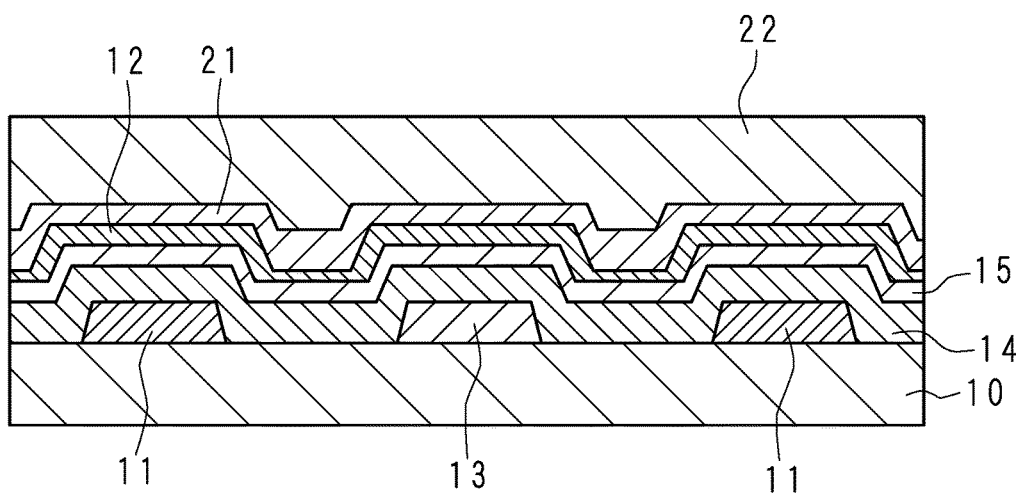
FIG. 5 is a schematic cross-sectional view illustrating portions of the active matrix substrate according to Embodiment 1 of the present invention, in which gate wirings and a source wiring intersect.

FIG. 1 is a schematic perspective view illustrating a television receiving apparatus (hereinafter, referred to as a TV receiving apparatus) 1 according to Embodiment 1 of the present invention, FIG. 2 is a schematic cross-sectional view illustrating a display panel 3 according to Embodiment 1, FIG. 3 is a schematic plan view illustrating a pixel of an active matrix substrate 30 according to Embodiment 1, FIG. 4 is a schematic cross-sectional view illustrating a portion in which a TFT 25 of the active matrix substrate 30 is provided, and FIG. 5 is a schematic cross-sectional view illustrating portions in which gate wirings 11 and a source wiring 12 of the active matrix substrate 30 intersect.

The TV receiving apparatus 1 includes a horizontally long display module 2 which displays an image, a tuner 6 which receives broadcast waves from an antenna (not illustrated), and a decoder 7 which decodes the encoded broadcast waves. In the TV receiving apparatus 1, the broadcast wave received by the tuner 6 is decoded by the decoder 7 and the image is displayed on the display module 2 based on the decoded information. The TV receiving apparatus 1 includes a stand 8 for supporting the TV receiving apparatus 1 provided at a bottom thereof.

For example, in a case of an edge light type, the display module 2 includes the display panel 3, three optical sheets (hereinafter, not illustrated), a light guide plate, a reflection sheet, and a chassis.

The display module 2 is housed longitudinally between a front cabinet 4 and a rear cabinet 5 which are disposed longitudinally in front and back. The front cabinet 4 is a rectangular frame body covering peripheral edge parts of the display module 2, and has a rectangular opening 2a in a center thereof. The front cabinet 4 is made of, for example, a plastic material. The rear cabinet 5 has a rectangular tray shape of which the front side is open, and is made of, for example, a plastic material. Further, the front cabinet 4 and the rear cabinet 5 may be made of other materials.

Vertical and horizontal dimensions of the front cabinet 4 and the rear cabinet 5 are substantially the same as each other, and the peripheral edge portions thereof are opposite to each other. The vertical and horizontal dimensions of the display panel 3 are slightly larger than those of the opening 2a of the front cabinet 4, and peripheral edge portions of the display panel 3 are opposite to inner edge portions of the front cabinet 4.

The display panel 3 includes the active matrix substrate 30 and an opposite substrate (color filter substrate) 31, which are opposite to each other, a liquid crystal layer 32 provided between the active matrix substrate 30 and the opposite substrate 31 as a display medium layer, and a seal material 33 provided in a frame shape for adhering the active matrix substrate 30 and the opposite substrate 31 to each other and for sealing the liquid crystal layer 32 between the active matrix substrate 30 and the opposite substrate 31.

As illustrated in FIG. 3, the active matrix substrate 30 includes a plurality of gate wirings 11 provided so as to extend parallel to each other on an insulating substrate 10 such as a glass substrate, for example, a plurality of capacitance wirings 13 which are respectively provided between the respective gate wirings 11 and extend parallel to each other, a plurality of source wirings 12 provided so as to extend parallel to each other in a direction intersecting the respective gate wirings 11, a plurality of TFTs 25 respectively provided for each intersecting portion of the respective gate wirings 11 and the respective source wirings 12, that is, for each pixel, a plurality of pixel electrodes 23 respectively connected to the respective TFTs 25, and an alignment film (not illustrated) provided so as to cover the respective pixel electrodes 23.

As illustrated in FIG. 5, an interlayer insulating film 14 and a gate insulating film 15 are interposed at portions including the gate wiring 11, the capacitance wiring 13, and the intersecting portion of the gate wiring 11 and the source wiring 12, on a lower side of the source wiring 12 of the active matrix substrate 30.

The interlayer insulating film 14 is made using the cured material of the siloxane composition of the present invention.

The siloxane composition is a material having adequate heat resistance to the thermal budget in the subsequent process, and prevents a variation in physical properties which may cause a problem in device characteristics, for example, even when exposed to the thermal budget in the film formation process of the gate insulating film 15. In order to be resistant to the thermal budget in the film formation process of the gate insulating film 15, it is preferable to have heat resistance of 300° C. or higher. In the present invention, the heat resistance is defined with a temperature at which stability such as electrical insulation properties, permittivity, coloring of a transparent film, whitening, film thickness, etc. can be maintained in the curing process of the siloxane composition and after exposure to the thermal budget after the curing process. That is, the physical properties are maintained after exposure to the thermal budget.

In addition, it is preferable that a light transmittance (transmittance) of the interlayer insulating film 14 may be secured to be 90% or more even when exposed to the above-described thermal budget. Herein, the light transmittance is defined with a transmittance for a film of a thickness of 2 μm by light having a wavelength of 400 nm after applying a thermal budget at 300° C. for 1 hour based on that of a film after curing at a temperature of 300° C. or lower on a glass substrate.

Further, a relative permittivity of the interlayer insulating film 14 is preferably 4 or less.

Further, in order to prevent a decrease in a rate of non-defective products caused by a defective operation of the device which is generated by contamination of a heating vacuum furnace resulted from a sublimate, or the like due to the thermal budget after curing, it is desirable for the cured film to be limited to a small amount of thickness reduction (film loss) due to the thermal budget. That is, it is preferable that the film loss at 300° C. is 5% or less. Herein, the film loss is obtained from a thickness (i) of the film at room temperature, which is cured under conditions of 230° C. for 30 minutes or more, and a thickness (ii) of the film at room temperature after further applying the thermal budget at 300° C. for 1 hour (under normal pressure in an air or nitrogen atmosphere) to the cured film, by using the following equation.

$$\text{Film loss}=((i)-(ii))/(i)(\%)$$

In addition, a passivation film 21 is formed on the source wiring 12 so as to cover the same, and an interlayer insulating film 22 including an organic material is formed on the passivation film 21 so as to cover and planarize the same. A pixel electrode 23 is patterned on the interlayer insulating film 22.

As illustrated in FIG. 4, a gate electrode 11a (forming a part of the gate wiring 11) and the capacitance wiring 13 are formed on the insulating substrate 10 of the active matrix substrate 30.

The interlayer insulating film 14 is formed on the insulating substrate 10 so as to cover the same. On the gate electrode 11a and on the capacitance wiring 13, portions other than the respective end edge parts thereof are not covered with the interlayer insulating film 14, and opening parts Ca and Ca are formed therein. A gate insulating film 15 is formed on the interlayer insulating film 14, on the gate electrode 11a and on the capacitance wiring 13, and a semiconductor film 16 is formed on a portion of the gate insulating film 15 corresponding to the opening part Ca on the gate electrode 11a side. In addition, an $n^+$ film 17 is formed on the semiconductor film 16 so as to cover the same, a source region and a drain region are formed thereon, and a source electrode 18 and a drain electrode 19 are formed on the source region and the drain region. The TFT 25 is constituted by the gate electrode 11a, the gate insulating film 15, the semiconductor film 16, the $n^+$ film 17, the source electrode 18, and the drain electrode 19.

Further, the passivation film 21 is formed on the source electrode 18 and the drain electrode 19 so as to cover the same, and the interlayer insulating film 22 is formed on the passivation film 21 so as to cover the same.

As illustrated in FIGS. 3 and 4, a capacitance electrode 20 is formed at a position corresponding to the capacitance wiring 13 on the gate insulating film 15. A pixel electrode 23 is formed on the capacitance electrode 20.

The pixel electrode 23 is connected to the capacitance electrode 20 in the opening part Cb on an upper side of the opening part Ca, and the capacitance electrode 20 is overlaid with the capacitance wiring 13 through the gate insulating film 15, thereby an auxiliary capacitor is formed. The capacitance electrode 20 is connected to the drain electrode 19 by a drain wiring 27.

In the display panel 3, in each pixel, when a gate signal is sent from a gate driver (not illustrated) to the gate electrode 11a through the gate wiring 11, and the TFT 25 is turned on, a source signal from a source driver (not illustrated) is sent to the source electrode 18 through the source wiring 12. At a timing when the gate of the TFT 25 is turned on, the source signal is written into the drain electrode 19, the drain connection wiring 27, and the pixel electrode 23, and a potential difference is generated between the same and a common electrode of the opposite substrate 31 in accordance with the applied voltage, and an image is displayed by changing the transmittance of the liquid crystal layer 32.

FIGS. 6A to 6E and FIGS. 7F to 7H are schematic cross-sectional views illustrating manufacturing processes of a method of manufacturing the active matrix substrate 30 according to the present embodiment.

Figure 6A:
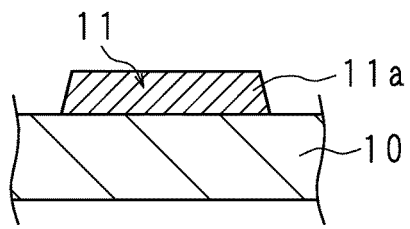
FIG. 6A is a schematic cross-sectional view illustrating a manufacturing process of a method of manufacturing the active matrix substrate according to Embodiment 1 of the present invention.

First, a metal film, in which for example, a titanium film (with a thickness of about 50 nm), an aluminum film (with a thickness of about 200 nm), a titanium film (with a thickness of about 100 nm), and the like are sequentially laminated, is formed on the entire substrate of the insulating substrate 10 such as a glass substrate by a sputtering method, and then photolithography using a photomask, dry etching of the metal film, removing the resist, and rinsing are performed to form a gate wiring (also form a part to be the gate electrode 11a) 11, and a capacitance wiring 13 (FIG. 6A). Further, the metal film is not limited to the above three-layer structure, and may be a Cu film or the like.

Figure 6B:
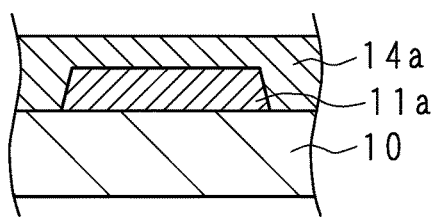
FIG. 6B is a schematic cross-sectional view illustrating a manufacturing process of the method of manufacturing the active matrix substrate according to Embodiment 1 of the present invention.
Figure 6C:
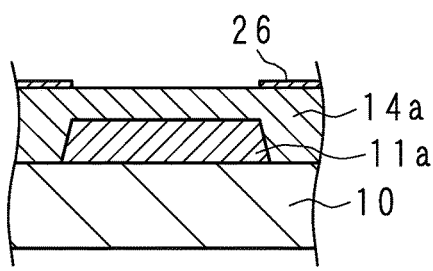
FIG. 6C is a schematic cross-sectional view illustrating a manufacturing process of the method of manufacturing the active matrix substrate according to Embodiment 1 of the present invention.
Figure 6D:
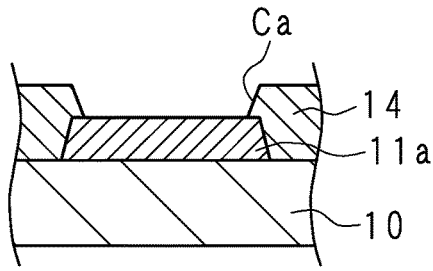
FIG. 6D is a schematic cross-sectional view illustrating a manufacturing process of the method of manufacturing the active matrix substrate according to Embodiment 1 of the present invention.
Figure 8:
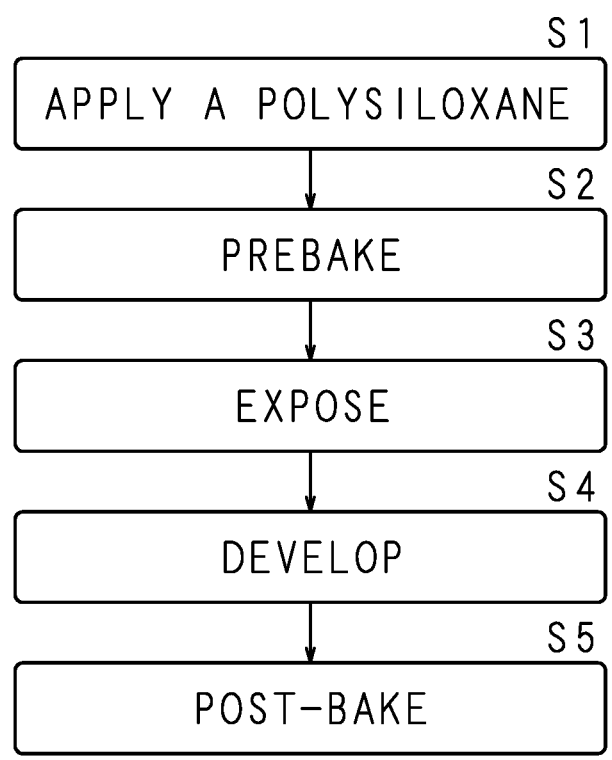
FIG. 8 is a flowchart illustrating a processing procedure for forming an interlayer insulating film according to Embodiment 1 of the present invention.

Next, an interlayer insulating film 14 is formed (FIGS. 6B to 6D). FIG. 8 is a flowchart illustrating a processing procedure for forming the interlayer insulating film.

First, a siloxane composition according to the present invention is applied to the substrate 10 including the gate wiring 11 and the capacitance wiring 13 by spin coating to form a film 14a (S1, and FIG. 6B).

After forming the film 14a, prebaking is performed thereon, for example, at 100° C. for 90 seconds to adjust a thickness thereof (S2).

After the prebake, the film 14a is exposed to light using a photomask 26 (S3, and FIG. 6C).

After the exposure, developing is performed thereon in a 2.38% TMAH aqueous solution (S4). Thereby, a pattern, in which the opening parts Ca and Ca are opened without residue, or the like, is formed.

Finally, post baking is performed thereon, for example, at 250° C., and the film 14a is cured to obtain the interlayer insulating film 14 (S5, and FIG. 6 D).

A film is formed on the interlayer insulating film 14 by a chemical vapor deposition (CVD) method, for example, using silicon oxide, silicon nitride, or the like, followed by patterning the same to form a gate insulating film 15.

As described above, the interlayer insulating film 14 has a heat resistance of 300° C. or higher, and prevents a variation in physical properties even when exposed to the thermal budget in the film formation process of the gate insulating film 15.

Figure 6E:
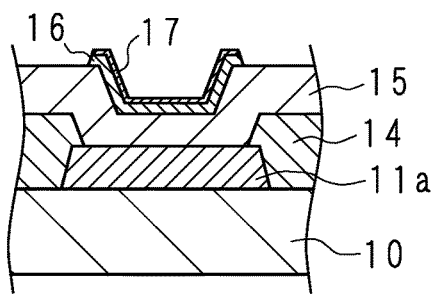
FIG. 6E is a schematic cross-sectional view illustrating a manufacturing process of the method of manufacturing the active matrix substrate according to Embodiment 1 of the present invention.

Next, a film made of amorphous silicon, etc., a film made of $n^+$ amorphous silicon, etc. is formed by, for example, the CVD method and patterned, thus to form a semiconductor film 16 and an $n^+$ film 17 corresponding to the source region and the drain region (FIG. 6E).

Figure 7F:
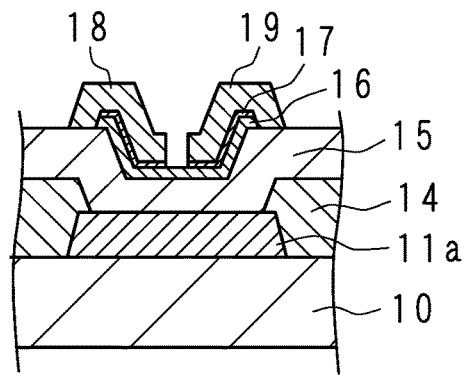
FIG. 7F is a schematic cross-sectional view illustrating a manufacturing process of the method of manufacturing the active matrix substrate according to Embodiment 1 of the present invention.

Then, Mo, etc. is deposited by, for example, a sputtering method and patterned, thus to form a source electrode 18 and a drain electrode 19 (FIG. 7F). At this time, a capacitance electrode 20 is formed on a portion of the gate insulating film 15 corresponding to the opening part Ca on the capacitance wiring 13 side (not illustrated).

Figure 7G:
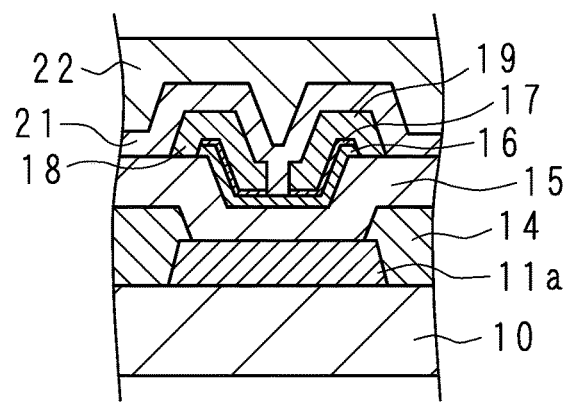
FIG. 7G is a schematic cross-sectional view illustrating a manufacturing process of the method of manufacturing the active matrix substrate according to Embodiment 1 of the present invention.

A film made of silicon nitride, etc. is formed on the source electrode 18 and the drain electrode 19 by, for example, the CVD method and patterned, thus to form a passivation film 21, and a film made of, for example, a synthetic resin such as an acrylic resin is formed on the passivation film 21 and patterned, thus to form an interlayer insulating film 22 (FIG. 7G).

Figure 7H:
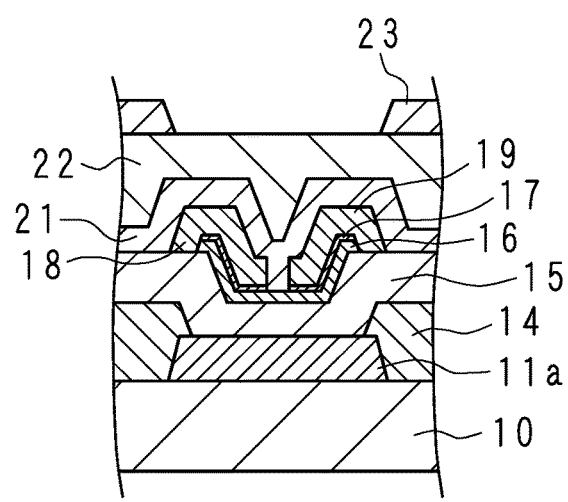
FIG. 7H is a schematic cross-sectional view illustrating a manufacturing process of the method of manufacturing the active matrix substrate according to Embodiment 1 of the present invention.

An ITO film is formed on the interlayer insulating film 22 by, for example, a sputtering method and patterned, thus to form a pixel electrode 23 (FIG. 7H).

In the present embodiment, when forming the film 14a containing the siloxane composition according to the present invention, and then forming the pattern including the opening parts Ca and Ca, since the resist applying process, the etching process, and the resist removal process are unnecessary, it is possible to simplify the manufacturing process. Substrate warpage due to a film stress is also suppressed, and the occurrence of difficulties in the processing flow of the substrate during manufacturing is also suppressed. In addition, by eliminating the etching process, by-products (foreign matters) are not generated, crack resistance is good, and foreign matters derived from the siloxane composition are not generated, such that the occurrence rate of defects is reduced and the yield is improved. Therefore, the manufacturing costs may be reduced.

Further, the interlayer insulating film 14 has a transmittance of 90% or more, and the display panel 3 provided with the active matrix substrate 30 having the interlayer insulating film 14 has good transmittance.

Embodiment 2

Figure 9:
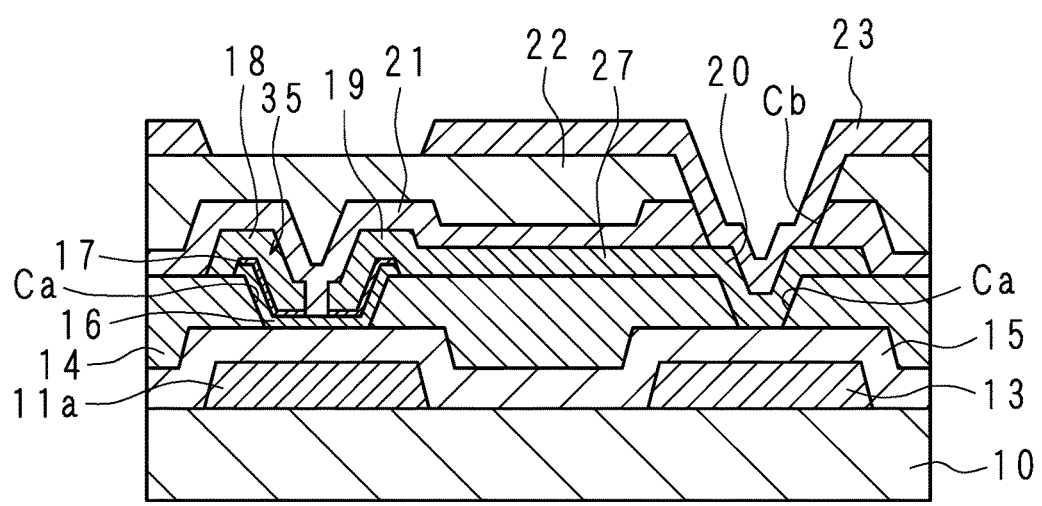
FIG. 9 is a schematic cross-sectional view illustrating a portion of an active matrix substrate according to Embodiment 2 of the present invention, in which a TFT is provided.
Figure 10:
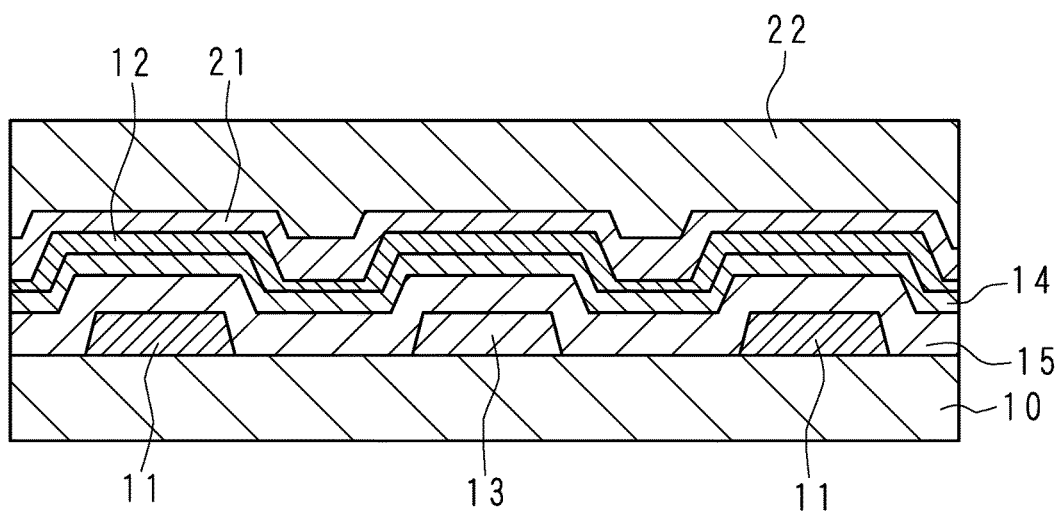
FIG. 10 is a schematic cross-sectional view illustrating portions of the active matrix substrate according to Embodiment 2 of the present invention, in which gate wirings and a source wiring intersect.

A display module according to Embodiment 2 of the present invention has the same configuration as the display module 2 according to Embodiment 1 except that the film formation order of an interlayer insulating film 14 and the gate insulating film 15 of an active matrix substrate 34 is different therefrom. FIG. 9 is a schematic cross-sectional view illustrating a portion of the active matrix substrate 34, in which a TFT 35 is provided, and FIG. 10 is a schematic cross-sectional view illustrating portions of the active matrix substrate 34, in which gate wirings 11 and a source wiring 12 intersect. In FIGS. 9 and 10, the same parts as those in FIGS. 4 and 5 will be denoted by the same reference numerals, and will not be described in detail.

As illustrated in FIG. 10, at an intersecting portion of the gate wiring 11 and the source wiring 12 of the active matrix substrate 34, a gate insulating film 15 and the interlayer insulating film 14 are interposed between the gate wiring 11 formed on an insulating substrate 10 and the source wiring 12 in this order from the insulating substrate 10 side.

The interlayer insulating film 14 is made of an SOG material having the same siloxane composition according to the present invention as described above.

As illustrated in FIG. 9, on the insulating substrate 10 of the active matrix substrate 34, a gate electrode 11a and a capacitance wiring 13 are formed.

The gate insulating film 15 is formed on the insulating substrate 10, the gate wiring 11 including the gate electrode 11a, and the capacitance wiring 13 so as to cover the same. The interlayer insulating film 14 is formed on the gate insulating film 15 so as to cover the same. In addition, opening parts Ca and Ca are formed on portions of the interlayer insulating film 14 corresponding to the gate electrode 11a and the capacitance wiring 13. A semiconductor film 16 and an $n^+$ film 17 are formed in this order in the opening part Ca of the interlayer insulating film 14 on the gate electrode 11a side.

In the present embodiment, when forming a film 14a containing the siloxane composition according to the present invention, and then patterning the same, since the resist applying process, the etching process, and the resist peeling-off process are unnecessary, the manufacturing costs may be reduced. An occurrence of difficulties in the processing flow of the substrate during manufacturing the same may also be suppressed. In addition, by eliminating the etching process, by-products are not generated, and crack resistance is good, such that foreign matters derived from the siloxane composition are not generated, and the occurrence rate of defects is reduced, thereby improving the yield.

The interlayer insulating film 14 has a transmittance of 90% or more, and the display panel 3 has good transmittance.

Embodiment 3

Figure 11:
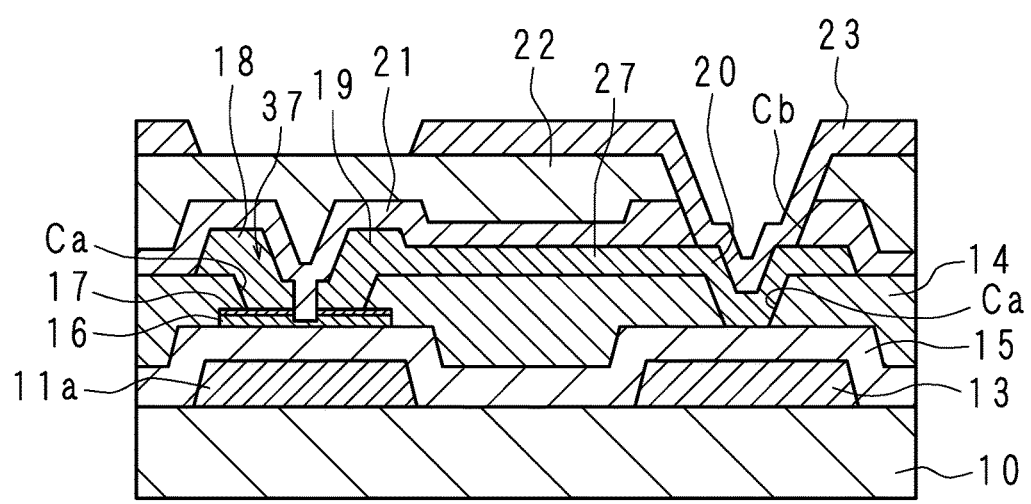
FIG. 11 is a schematic cross-sectional view illustrating a portion of an active matrix substrate according to Embodiment 3 of the present invention, in which a TFT is provided.

A display apparatus according to Embodiment 3 of the present invention has the same configuration as the display apparatus according to Embodiment 2 except that a semiconductor film 16 and an $n^+$ film 17 are formed, and then an interlayer insulating film 14 is formed in an active matrix substrate 36. FIG. 11 is a schematic cross-sectional view illustrating a portion of the active matrix substrate 36, in which a TFT 37 is provided. In the active matrix substrate 36, the configuration of a portion in which a gate wiring 11 and a source wiring 12 intersect is the same as the configuration of the portion in which the gate wiring 11 and the source wiring 12 according to Embodiment 2 intersect. In FIG. 11, the same parts as those in FIG. 9 will be denoted by the same reference numerals, and will not be described in detail.

As illustrated in FIG. 11, a gate electrode 11a and a capacitance wiring 13 are formed on an insulating substrate 10 of the active matrix substrate 36.

A gate insulating film 15 is formed on the insulating substrate 10, the gate wiring 11 including the gate electrode 11a, and the capacitance wiring 13 so as to cover the same. A semiconductor film 16 and an $n^+$ film 17 are formed in this order on a portion of the gate insulating film 15 corresponding to the gate electrode 11a. The interlayer insulating film 14 is formed on the gate insulating film 15 so as to cover the same. Opening parts Ca and Ca are formed in portions of the interlayer insulating film 14 corresponding to the gate electrode 11a and the capacitance wiring 13.

In the present embodiment, when forming a film 14a containing the siloxane composition according to the present invention, and then patterning the same, since the resist applying process, the etching process, and the resist removal process are unnecessary, the manufacturing costs may be reduced. An occurrence of difficulties in the processing flow of the substrate during manufacturing the same may also be suppressed. In addition, by eliminating the etching process, by-products are not generated, and crack resistance is good, such that foreign matters derived from the siloxane composition are not generated, and the occurrence rate of defects is reduced, thereby improving the yield.

The interlayer insulating film 14 has a transmittance of 90% or more, and the display panel 3 has good transmittance.

Embodiment 4

Figure 12:
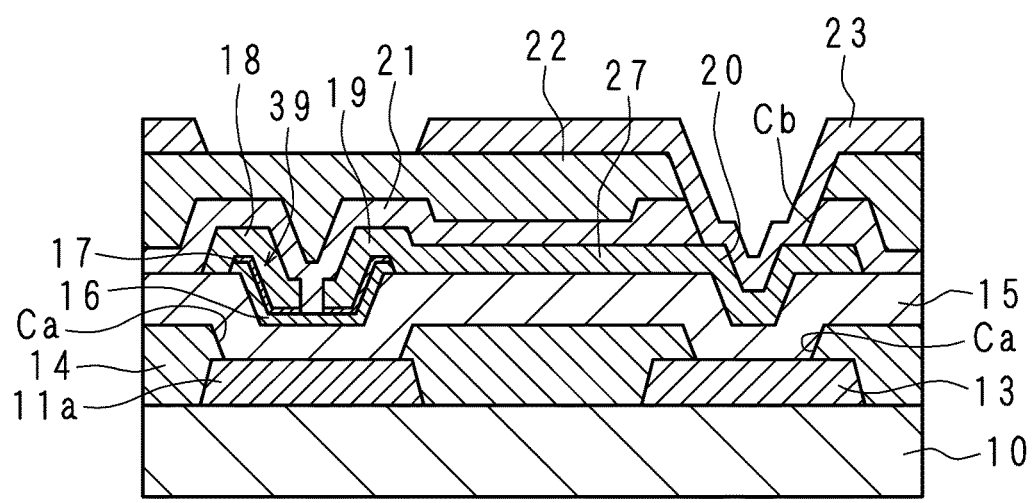
FIG. 12 is a schematic cross-sectional view illustrating a portion of an active matrix substrate according to Embodiment 4 of the present invention, in which a TFT is provided.

A display apparatus according to Embodiment 4 of the present invention has the same configuration as the display module 2 according to Embodiment 1 except that a material of an interlayer insulating film 22 of an active matrix substrate 38 includes the same siloxane composition according to the present invention as the interlayer insulating film 14. FIG. 12 is a schematic cross-sectional view illustrating a portion of the active matrix substrate 38, in which a TFT 39 is provided. In the active matrix substrate 38, the configuration of a portion in which a gate wiring 11 and a source wiring 12 intersect is the same as that of the portion in which the gate wiring 11 and the source wiring 12 according to Embodiment 1 intersect. In FIG. 12, the same parts as those in FIG. 4 will be denoted by the same reference numerals, and will not be described in detail.

As described above, the interlayer insulating film 22 is formed using the same siloxane composition as the interlayer insulating film 14, not an acrylic resin.

Accordingly, in the present embodiment, it is possible to share a material of the film constituting the active matrix substrate 38 and an equipment of film formation, as well as it is possible to reduce the manufacturing costs, and facilitate the management of the material.

Embodiment 5

Figure 13:
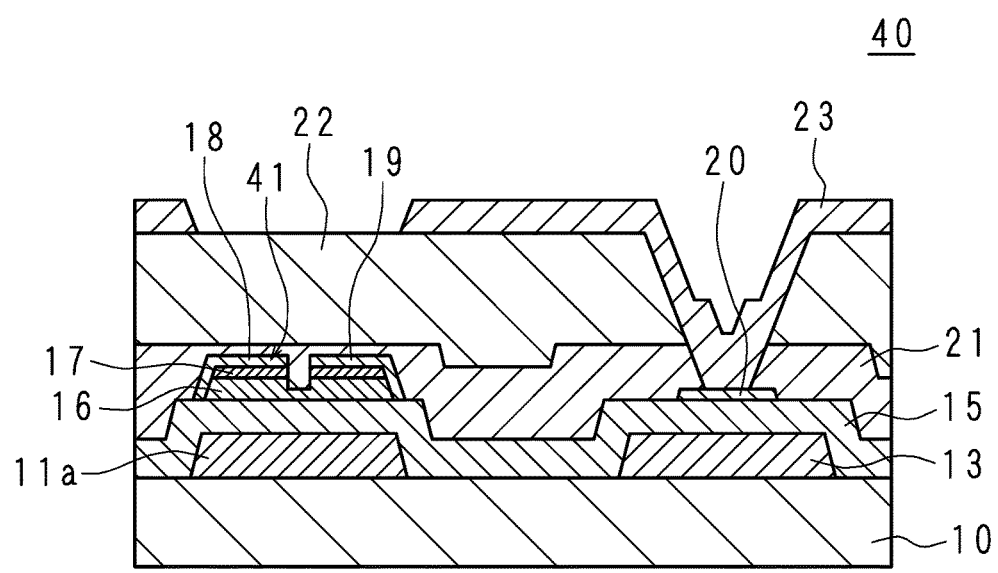
FIG. 13 is a schematic cross-sectional view illustrating a portion of an active matrix substrate according to Embodiment 5 of the present invention, in which a TFT is provided.
Figure 14:
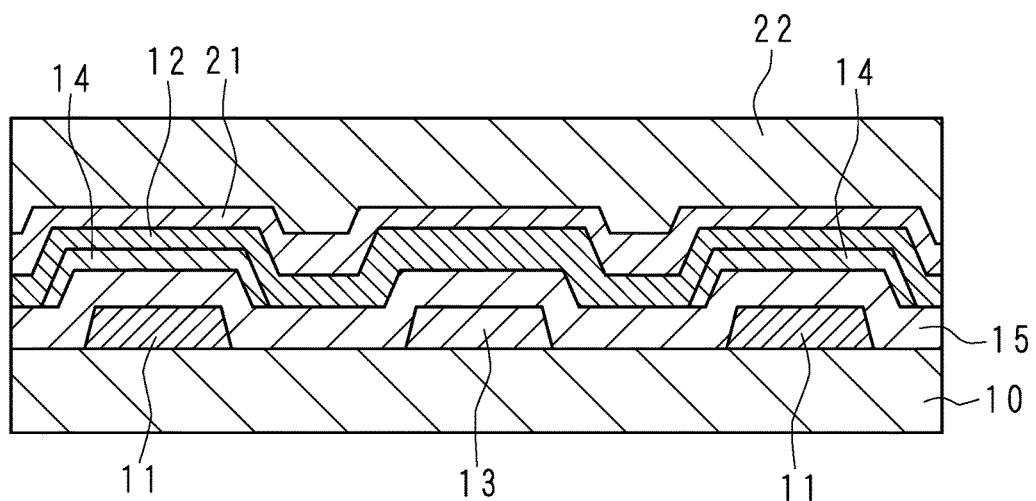
FIG. 14 is a schematic cross-sectional view illustrating portions of the active matrix substrate according to Embodiment 5 of the present invention, in which gate wirings and a source wiring intersect.
Figure 15:
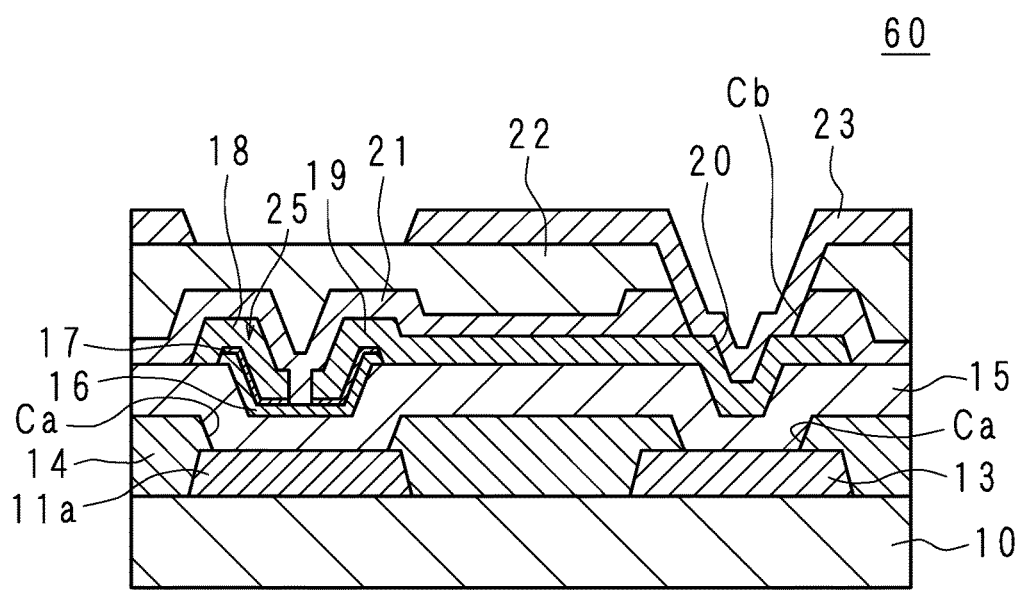
FIG. 15 is a schematic cross-sectional view illustrating an example for a structure of a portion of a conventional active matrix substrate, in which a TFT is formed.
Figure 16:
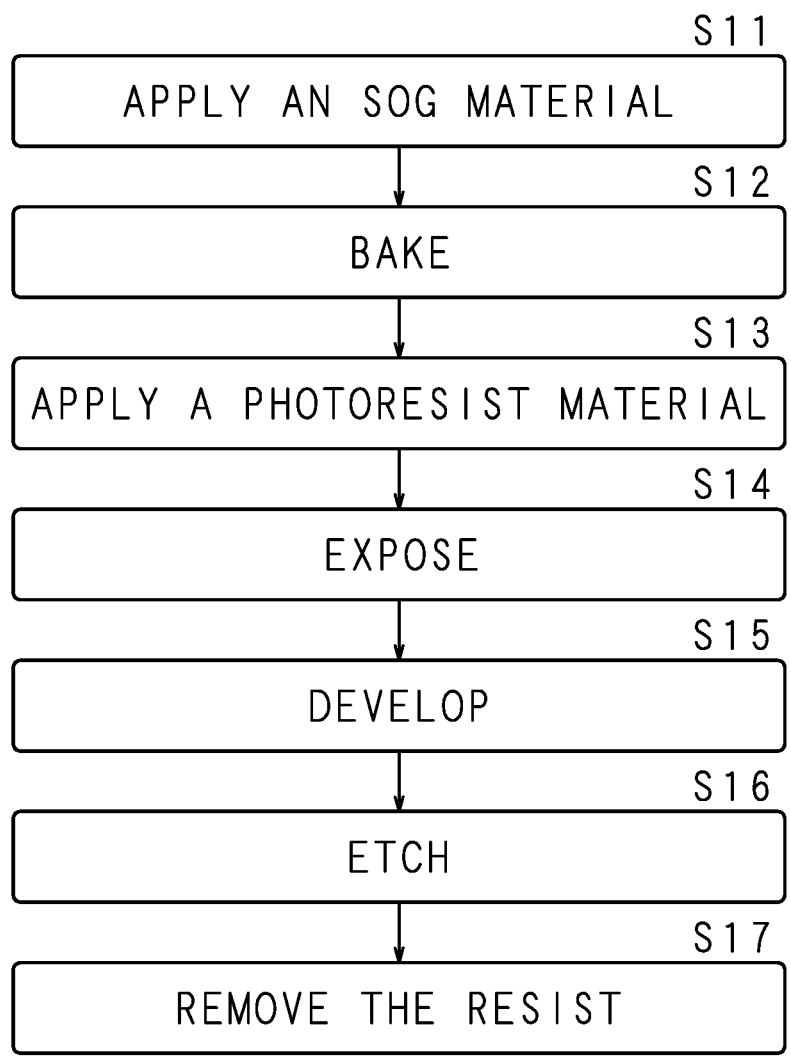
FIG. 16 is a flowchart illustrating a processing procedure for forming a conventional interlayer insulating film.

A display apparatus according to Embodiment 5 of the present invention has the same configuration as the display apparatus according to Embodiment 2 except that the formation pattern of an interlayer insulating film 14 is different therefrom in an active matrix substrate 40. FIG. 13 is a schematic cross-sectional view illustrating a portion of the active matrix substrate 40, in which a TFT 41 is provided, and FIG. 14 is a schematic sectional view illustrating portions of the active matrix substrate 40, in which gate wirings 11 and a source wiring 12 intersect. In FIGS. 13 and 14, the same parts as those in FIGS. 9 and 10 will be denoted by the same reference numerals, and will not be described in detail.

As illustrated in FIG. 14, at the intersecting portions of the gate wirings 11 and the source wiring 12 of the active matrix substrate 40, a gate insulating film 15 and an interlayer insulating film 14 are interposed between the gate wiring 11 formed on the insulating substrate 10 and the source wiring 12 in this order from the insulating substrate 10 side.

The interlayer insulating film 14 is made of the same siloxane composition according to the present invention as described above.

In the active matrix substrate 40, unlike the active matrix substrate 34 according to Embodiment 2, the interlayer insulating film 14 is not formed on the corresponding gate insulating film 15 between the gate wirings 11. As will be described below, the interlayer insulating film 14 is not formed on an upper side of a portion of the gate wiring 11, in which a gate electrode 11a is formed.

As illustrated in FIG. 13, the gate electrode 11a and a capacitance wiring 13 are formed on the insulating substrate 10 of the active matrix substrate 40.

As described above, the interlayer insulating film 14 is not formed on the upper side of the portion of the gate wiring 11, in which the gate electrode 11a is formed. Also, the interlayer insulating film 14 is not formed on the upper side of the capacitance wiring 13 and between the gate wiring 11 and the capacitance wiring 13.

According to the method of manufacturing the active matrix substrate of the present invention using the positive type photosensitive siloxane composition of the present invention, the interlayer insulating film 14 may be formed without performing the etching process, and by-products based on the siloxane composition are not generated, and an occurrence of inter-wiring leakage is suppressed, such that the interlayer insulating film 14 may be provided only at a minimum necessary portion, which is required to reduce the inter-wiring capacitance, such as the intersecting portion of the gate wiring 11 and the source wiring 12. Therefore, by designing so as not to dispose the interlayer insulating film 14 on a pixel portion desired to secure the transmittance, a portion of the capacitance wiring 13 desired to increase the capacitance, and the portions of the opening parts Ca and Ca, the display panel 3 provided with the active matrix substrate 40 has good transmittance.

EXAMPLE

Hereinafter, the present invention will be described in more detail with reference to examples and comparative examples, but the present invention is not limited to these examples and comparative examples.

Synthetic Example

First, a synthesis example of a polysiloxane of the present invention will be shown below. For the measurement, the following apparatus was used.

GPC (gel permeation chromatography): HLC-8220 GPC (manufactured by Tosoh Co. Ltd.)

Spin coater: MS-A100 (manufactured by Mikasa Co., Ltd.)

Synthesis Example 1

Synthesis of Polysiloxane (Ia): Synthesis of Alkaline Catalyst 36.5 g of a 25 mass % tetramethylammonium hydroxide (TMAH) aqueous solution, 800 ml of isopropyl alcohol (IPA), and 2.0 g of water were charged into a 2 L flask equipped with a stirrer, a thermometer, and a cooling pipe, and then a mixed solution of 39.7 g of phenyltrimethoxysilane, 34.1 g of methyltrimethoxysilane and 7.6 g of tetramethoxysilane was prepared in a dropping lot. This mixed solution was dropped into the flask at 10° C., subsequently stirred at the same temperature for 3 hours, and then neutralized by adding a 10% HCl aqueous solution. 400 ml of toluene and 100 ml of water were added to the neutralized solution, and the mixed solution was separated into two layers. The obtained organic layer was concentrated under reduced pressure to remove a solvent, and propylene glycol monomethylether acetate (PGMEA) was added to the concentrate so as to adjust the solid concentration to be 40 mass %.

When a molecular weight (in terms of polystyrene) of the obtained polysiloxane was measured by the GPC, a mass average molecular weight (hereinafter also abbreviated as an "Mw") was 2,200. In addition, the obtained resin solution was applied to a silicon wafer by a spin coater so as to form a film having a thickness of 2 μm after the prebake, and when a dissolution rate (hereinafter also abbreviated as an "ADR") in a 5% TMAH aqueous solution was measured after the prebake, the ADR was 490 Å/sec.

Synthesis Example 2

Synthesis of Polysiloxane (Ib): Synthesis of Alkaline Catalyst

In the same manner as in Synthesis Example 1, 54.7 g of a 25 mass % TMAH aqueous solution and 800 ml of IPA were charged, and then a mixed solution of 39.7 g of phenyltrimethoxysilane, 34.1 g of methyltrimethoxysilane and 7.6 g of tetramethoxysilane was prepared in a dropping lot. This mixed solution was dropped into the flask at 10° C., subsequently stirred at the same temperature for 3 hours, and then neutralized by adding a 10% HCl aqueous solution. 400 ml of toluene and 100 ml of water were added to the neutralized solution, and the mixed solution was separated into two layers. The obtained organic layer was concentrated under reduced pressure to remove a solvent, and PGMEA was added to the concentrate so as to adjust the solid content concentration to be 40 mass %. When a molecular weight (in terms of polystyrene) of the obtained polysiloxane, and an ADR in a 2.38% TMAH aqueous solution were measured in the same manner as in Synthesis Example 1, the Mw and the ADR in a 2.38% TMAH aqueous solution were 1,810, and 1,470 Å/sec, respectively.

Example 1

Positive Type Photosensitive Siloxane Composition 1

A mixture of polysiloxane mixed in a ratio of (Ia):(Ib)= (12 mass %):(88 mass %), 6 mass % of diazonaphthoquinone 2.8 mol modified body of 4-4'(1-(4-(1-(4-hydroxyphenol)-1-methylethyl) phenyl) ethylidene) bisphenol (hereinafter abbreviated as a "PAC") with respect to the polysiloxane, 3 mass % of a boronic acid photoacid generator "CPI-310 B" (manufactured by San Apro Co.) (Hereinafter abbreviated as a "PAG") with respect to the polysiloxane, and 0.3 mass % of "KF-53" (manufactured by Shin-Etsu Chemical Co., Ltd.) with respect to the polysiloxane as a surfactant was prepared as a solid content and a mixed solvent of 94% PGMEA and 6% gamma butyrolactone as a solvent was used so as to adjust the solid content concentration to be 35 mass %, thus to obtain a photosensitive siloxane composition 1.

This photosensitive siloxane composition 1 was applied to a silicon wafer by spin coating, subsequently pre-baked on a hot plate at 100° C. after the application, and finally adjusted so as to form a film having a thickness of 2.3 µm. After the prebake, the film was exposed to light at 450 mJ/cm² using a g-, h-line exposure apparatus "FX-604" stepper (manufactured by Nikon co., Ltd. NA=0.1), subsequently developed in a 2.38% TMAH aqueous solution at room temperature for 100 seconds, and then rinsed with pure water. Thereafter, bleaching of residual PAC in the film was performed by exposing the entire surface thereof at 2000 mJ/cm² using "PLA-501F" (manufactured by Canon Co., Ltd.) as an exposure machine. Then, the film was cured in an air at 230° C. for 30 minutes using a hot plate to prepare a cured film. The final film after curing had a thickness of 2.1 µm. Thereafter, it was confirmed by performing SEM observation that a 3 µm contact hole (the opening part) pattern was removed, which is a resolution limit of the "FX-604" apparatus. Herein, whether a contact hole is formed or not was determined by formation of a bottom contact of 80% or more with respect to the contact hole design of the mask.

A specimen for measuring transmittance was made by the following procedure. The above siloxane composition 1 was applied to glass ("Eagle XG", thickness 0.7 mm, manufactured by Corning Co.) by spin coating, subsequently pre-baked on a hot plate at 100° C. after the application, and finally adjusted to form a film having a thickness of 2.3 µm. The film was developed in a 2.38% TMAH aqueous solution at room temperature for 100 seconds, and then rinsed with pure water. Thereafter, bleaching of residual PAC in the film was performed by exposing the entire surface thereof at 2000 mJ/cm² using the "PLA-501F." Then, the film was cured in an air at 230° C. for 30 minutes using a hot plate to prepare a cured film. Thereafter, a thermal budget was applied thereto using a hot plate at 300° C. for 1 hour in the air. When an average film thickness after curing and after the thermal budget were obtained by SEM observation, respectively, the average thickness was 2.10 µm without change (with no film loss).

Measurement of the light transmittance was performed by measuring only the glass using "U-4000" (manufactured by Hitachi High-Technologies Co.) as a spectrophotometer and used as a reference. Next, when the specimen for measuring transmittance was measured, and the light transmittance at a wavelength of 400 nm per 2 µm of the film thickness was obtained, the light transmittance was 97%.

Example 2

Positive Type Photosensitive Siloxane Composition 2

A photosensitive siloxane composition 2 was obtained in the same manner as in Example 1 except that the amount of PAC was changed from 6 mass % to 9 mass % with respect to the polysiloxane.

This composition was applied to a substrate, a pattern was formed thereon, and the resolution of the pattern was confirmed in the same manner as in Example 1. As a result, it was confirmed that a contact hole pattern of 5 µm was removed without residue. In addition, when the light transmittance was measured in the same manner as in Example 1, and the light transmittance at a wavelength of 400 nm per 2 µm of film thickness was determined, the light transmittance was 92%. Further, when an average film thickness was determined in the same manner as in Example 1, the film thickness was decreased from 2.17 µm to 2.10 µm, and the film loss was 3.2%.

Comparative Example 1

Positive Type Photosensitive Siloxane Composition 3

A positive type photosensitive siloxane composition 3 was obtained in the same manner as in Example 1 except that PAG was not added.

This composition was applied to a substrate, a pattern was formed thereon, and the resolution of the pattern was confirmed in the same manner as in Example 1. As a result, a contact hole pattern of 20 µm could not be formed. Since a contact hole pattern of 3 µm can be confirmed likewise with Example 1 immediately after the development, it is considered that the contact holes are blocked by heat flow of the pattern at the time of heat curing at 230° C. In addition, when the light transmittance was measured in the same manner as in Example 1, that is, the light transmittance at a wavelength of 400 nm per 2 µm of film thickness was determined, the light transmittance was 97%. Further, when an average film thickness was determined in the same manner as in Example 1, the film thickness was decreased from 2.16 µm to 2.09 µm, and the film loss was 3.2%.

Comparative Example 2

Positive Type Photosensitive Siloxane Composition 4

A positive type photosensitive siloxane composition 4 was obtained in the same manner as in Example 1 except that PAG was not added, and the amount of PAC was changed from 6 mass % to 12 mass % with respect to the polysiloxane.

This composition was applied to a substrate, a pattern was formed thereon, and the resolution of the pattern was confirmed in the same manner as in Example 1. As a result, it was confirmed that a contact hole pattern of 5 µm was removed. In addition, when the light transmittance was measured in the same manner as in Example 1, that is, the light transmittance at a wavelength of 400 nm per 2 µm of film thickness was determined, the light transmittance was 87%. Further, when an average film thickness was determined in the same manner as in Example 1, the film thickness was decreased from 2.17 µm to 2.09 µm, and the film loss was 3.7%.

From the above Examples 1 and 2, and Comparative Examples 1 and 2, it was confirmed that the positive type photosensitive siloxane compositions of Examples 1 and 2 have good heat resistance and could form a pattern with high sensitivity and high definition.

Further, it should be understood that the present invention is not limited to the above-described Embodiments 1 to 5, and various modifications may be made within the scope defined by the appended claims. That is, embodiments obtained by combining technical means appropriately modified within the scope defined by the appended claims are also included in the technical scope of the present invention.

It is to be noted that, as used herein and in the appended claims, the singular forms "a", "an", and "the" include plural referents unless the context clearly dictates otherwise.

The invention claimed is:

1. A positive type photosensitive siloxane composition comprising: (I) at least two or more of polysiloxanes having different dissolution rates in a tetramethylammonium hydroxide (TMAH) aqueous solution, (II) a diazonaphthoquinone derivative, (III) a photoacid generator, and (IV) a solvent,
wherein the polysiloxane (I) is a mixture of:
(A) polysiloxane (Ia) whose film obtained by hydrolyzing and condensing a silane compound represented by formula (1) below in the presence of a basic catalyst, after a prebake, is soluble in a 5 mass % TMAH aqueous solution, and has a dissolution rate of 1000 Å/sec or less:

$$R^1{}_n Si(OR^2)_{4-n} \quad (1)$$

(wherein $R^1$ represents a linear, branched or cyclic alkyl group having 1 to 20 carbon atoms, in which arbitrary methylene may be substituted with oxygen, or an aryl group having 6 to 20 carbon atoms, in which arbitrary hydrogen may be substituted with fluorine, $R^2$ represents an alkyl group having 1 to 5 carbon atoms, and n represents 0 or 1), and
(B) polysiloxane (Ib) whose film obtained by hydrolyzing and condensing the silane compound represented by formula (1) in the presence of a basic catalyst or an acid catalyst, after the prebake, has a dissolution rate of 100 Å/sec or more in a 2.38 mass % TMAH aqueous solution, wherein
an amount of the diazonaphthoquinone derivative is 3 parts by mass to 6 parts by mass and an amount of the photoacid generator is 0.01 parts by mass to 10 parts by mass, respectively, relative to 100 parts by mass of the polysiloxane (I).

2. The positive type photosensitive siloxane composition according to claim 1, wherein the polysiloxane is obtained by reacting a silane compound of n=0 in the general formula (1) with 20 mol % or less.

3. An active matrix substrate comprising: a plurality of source wirings and a plurality of gate wirings formed on a substrate so as to intersect each other three-dimensionally; thin film transistors formed in the vicinity of portions in which the source wirings and the gate wirings intersect; and pixel electrodes formed to be electrically connected to the corresponding source wirings through the thin film transistors,
wherein an interlayer insulating film made of a cured material of the positive type photosensitive siloxane composition according to claim 2 is interposed at least between the source wiring and the gate wiring in the portion in which the source wiring and the gate wiring intersect.

4. The active matrix substrate according to claim 3, wherein the interlayer insulating film has heat resistance of 300° C. or higher,
a light transmittance of 90% or more,
an amount of the film thickness reduction of 5% or less at 300° C., and
a relative permittivity of 4 or less.

5. The active matrix substrate according to claim 3, further comprising: an interlayer insulating film made of the cured material on an upper side of the thin film transistor.

6. A display apparatus comprising:
the active matrix substrate according to claim 3;
a display medium layer disposed on the active matrix substrate; and
an opposite substrate disposed opposite to the active matrix substrate through the display medium layer.

7. A method of manufacturing an active matrix substrate comprising the processes of: forming a plurality of source wirings and a plurality of gate wirings on a substrate so as to intersect each other three-dimensionally; forming thin film transistors in the vicinity of portions in which the source wirings and the gate wirings intersect; and forming pixel electrodes to be electrically connected to the corresponding source wirings through the thin film transistors, and further comprising an interlayer insulating film forming process of forming the interlayer insulating film made of a cured material of the positive type photosensitive siloxane composition according to claim 2 at least between the source wiring and the gate wiring in the portion in which the source wiring and the gate wiring intersect,
wherein the interlayer insulating film forming process comprises the processes of:
forming the film using the positive type photosensitive siloxane composition at least on the gate wiring in the position in which the source wiring and the gate wiring intersect;
prebaking the formed film;
exposing the prebaked film to light;
developing the exposed film; and
baking the developed film.

8. An active matrix substrate comprising: a plurality of source wirings and a plurality of gate wirings formed on a substrate so as to intersect each other three-dimensionally; thin film transistors formed in the vicinity of portions in which the source wirings and the gate wirings intersect; and pixel electrodes formed to be electrically connected to the corresponding source wirings through the thin film transistors,
wherein an interlayer insulating film made of a cured material of the positive type photosensitive siloxane composition according to claim 1 is interposed at least between the source wiring and the gate wiring in the portion in which the source wiring and the gate wiring intersect.

9. The active matrix substrate according to claim 8, wherein the interlayer insulating film has heat resistance of 300° C. or higher,
a light transmittance of 90% or more,
an amount of the film thickness reduction of 5% or less at 300° C., and
a relative permittivity of 4 or less.

10. The active matrix substrate according to claim 8, further comprising: an interlayer insulating film made of the cured material on an upper side of the thin film transistor.

11. A display apparatus comprising:
the active matrix substrate according to claim 8;
a display medium layer disposed on the active matrix substrate; and
an opposite substrate disposed opposite to the active matrix substrate through the display medium layer.

12. A method of manufacturing an active matrix substrate comprising the processes of: forming a plurality of source wirings and a plurality of gate wirings on a substrate so as to intersect each other three-dimensionally; forming thin film transistors in the vicinity of portions in which the source wirings and the gate wirings intersect; and forming pixel electrodes to be electrically connected to the corresponding source wirings through the thin film transistors, and further comprising an interlayer insulating film forming process of forming the interlayer insulating film made of a cured material of the positive type photosensitive siloxane composition according to claim 1 at least between the source wiring and the gate wiring in the portion in which the source wiring and the gate wiring intersect, wherein the interlayer insulating film forming process comprises the processes of:

forming the film using the positive type photosensitive siloxane composition at least on the gate wiring in the position in which the source wiring and the gate wiring intersect;

prebaking the formed film;

exposing the prebaked film to light;

developing the exposed film; and baking the developed film.

* * * * *